(12) United States Patent
Fujitani et al.

(10) Patent No.: US 9,977,331 B2
(45) Date of Patent: May 22, 2018

(54) RESIST OVERLAYER FILM FORMING COMPOSITION AND METHOD FOR PRODUCING SEMICONDUCTOR DEVICE INCLUDING THE SAME

(71) Applicant: NISSAN CHEMICAL INDUSTRIES, LTD., Tokyo (JP)

(72) Inventors: Noriaki Fujitani, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days. days.

(21) Appl. No.: 15/119,209

(22) PCT Filed: Feb. 13, 2015

(86) PCT No.: PCT/JP2015/053969
§ 371 (c)(1),
(2) Date: Aug. 16, 2016

(87) PCT Pub. No.: WO2015/129486
PCT Pub. Date: Sep. 3, 2015

(65) Prior Publication Data
US 2017/0010535 A1    Jan. 12, 2017

(30) Foreign Application Priority Data
Feb. 26, 2014 (JP) .................. 2014-035854

(51) Int. Cl.
| | |
|---|---|
| *G03F 7/11* | (2006.01) |
| *C09D 125/16* | (2006.01) |
| *G03F 7/16* | (2006.01) |
| *G03F 7/20* | (2006.01) |
| *C09D 133/02* | (2006.01) |
| *G03F 7/32* | (2006.01) |
| *C08F 212/12* | (2006.01) |
| *H01L 21/027* | (2006.01) |
| *C08F 220/06* | (2006.01) |

(52) U.S. Cl.
CPC .............. *G03F 7/11* (2013.01); *C08F 212/12* (2013.01); *C09D 125/16* (2013.01); *C09D 133/02* (2013.01); *G03F 7/168* (2013.01); *G03F 7/2004* (2013.01); *G03F 7/32* (2013.01); *H01L 21/0271* (2013.01); *C08F 220/06* (2013.01)

(58) Field of Classification Search
CPC .......... G03F 7/11; G03F 7/0046; G03F 7/091; G03F 7/094; G03F 7/0007
See application file for complete search history.

(56) References Cited

U.S. PATENT DOCUMENTS

| | | | | |
|---|---|---|---|---|
| 2007/0122741 | A1* | 5/2007 | Hatakeyama | ............. G03F 7/11 430/270.1 |
| 2007/0178407 | A1* | 8/2007 | Hatakeyama | ......... C08F 220/18 430/270.1 |
| 2014/0242359 | A1* | 8/2014 | Nakamura | ................ G03F 7/40 428/201 |

(Continued)

FOREIGN PATENT DOCUMENTS

| | | |
|---|---|---|
| JP | 2004-348133 A | 12/2004 |
| JP | 2006-070244 A | 3/2006 |

(Continued)

OTHER PUBLICATIONS

Shimizu et al., "Development of Chemically Amplified EUV resist for 22nm half pitch and beyond" Exteme Ultraviolet Lithography Symposium, Miami, pp. 1-16, 2011.

(Continued)

*Primary Examiner* — Cynthia Hamilton
(74) *Attorney, Agent, or Firm* — Oliff PLC

(57) ABSTRACT

A resist overlayer film forming composition for use in a lithography process in semiconductor device production does not intermix with a resist, blocks undesirable exposure light particularly in EUV exposure, for example, UV and DUV and selectively transmits EUV alone, and can be developed with a developer after exposure. A resist overlayer film forming composition includes: a polymer (P) including unit structures of Formula (1) and Formula (2) and having a weight average molecular weight, measured by gel permeation chromatography, of 500 to 2,000; and a $C_{8-16}$ ether compound as a solvent

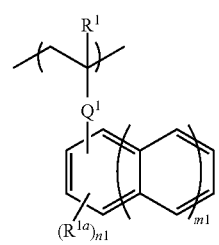
(1)

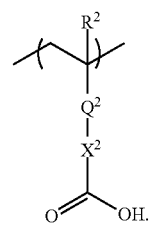

(2)

15 Claims, No Drawings

(56) References Cited

U.S. PATENT DOCUMENTS

2015/0030983 A1\* 1/2015 Hatakeyama ......... C08F 212/14
430/287.1

FOREIGN PATENT DOCUMENTS

| | | |
|---|---|---|
| JP | 2007-241053 A | 9/2007 |
| JP | 2008-065304 A | 3/2008 |
| JP | 2008-198788 A | 8/2008 |
| JP | 2008-532067 A | 8/2008 |
| JP | 2012-103738 A | 5/2012 |
| JP | 2013-228663 A | 11/2013 |
| WO | 2012/053302 A1 | 4/2012 |

OTHER PUBLICATIONS

La Fontaine et al., "Extreme Ultraviolet (EUV) Lithography II", Proceedings of Spie, vol. 7969, pp. 796916-1 to 796916-10, 2011.
Apr. 21, 2015 Written Opinion issued in International Patent Application No. PCT/JP2015/053969.
Apr. 21, 2015 International Search Report issued in International Patent Application No. PCT/JP2015/053969.

\* cited by examiner

RESIST OVERLAYER FILM FORMING COMPOSITION AND METHOD FOR PRODUCING SEMICONDUCTOR DEVICE INCLUDING THE SAME

TECHNICAL FIELD

The present invention relates to a resist overlayer film forming composition for lithography that is used in a process of producing a semiconductor device using photolithography and is effective in reducing adverse effects caused by exposure light and yielding a good resist pattern, a method for forming a resist pattern using the resist overlayer film forming composition for lithography, and a method for producing a semiconductor device using the forming method.

BACKGROUND ART

Microfabrication using photolithography techniques has conventionally been performed in production of semiconductor devices. The microfabrication is a process of forming a thin film of a photoresist composition on a substrate to be processed such as a silicon wafer, applying active light such as ultraviolet rays thereon through a mask pattern having semiconductor device patterns, developing the pattern, and etching the substrate to be processed such as a silicon wafer using the resulting photoresist pattern as a protection film (mask). With the high integration of semiconductor devices in recent years, the active light to be used has been changed to those at shorter wavelengths, for example, from KrF excimer laser (wavelength of 248 nm) to ArF excimer laser (wavelength of 193 nm). Accordingly, the effects of diffuse reflection or standing waves of active light from the substrate become a serious issue, and a method has been widely adopted in which a bottom anti-reflective coating (Bottom Anti-Reflective Coating, BARC) is provided as a resist underlayer film between the photoresist and the substrate to be processed, which serves the function of preventing reflection.

Known examples of the anti-reflective coatings include: inorganic anti-reflective coatings including, for example, titanium, titanium dioxide, titanium nitride, chromium oxide, carbon, and α-silicon; and organic anti-reflective coatings made from a light absorbing substance and a polymer compound. The former requires systems for forming coatings such as a vacuum deposition system, a CVD system, and a sputtering system, whereas the latter requires no special system. In this respect, organic anti-reflective coatings are advantageous and have been elaborately examined.

ArF immersion lithography in which exposure is performed through water has been practiced as a next-generation photolithography technique that replaces the photolithography technique using ArF excimer laser (wavelength of 193 nm). The photolithography techniques using light, however, have been approaching their limits. EUV lithography technique using EUV (at a wavelength of 13.5 nm) has been attracting attention as a new lithography technique after the ArF immersion lithography. In the semiconductor device production process using EUV lithography, a substrate covered with an EUV resist is exposed by EUV radiation and developed with a developer to form a resist pattern.

An overlayer on an EUV resist is described, which includes a polymer including a group containing one or more of beryllium, boron, carbon, silicon, zirconium, niobium, and molybdenum in order to protect the EUV resist from contaminants and to block undesirable radiation, for example, UV and DUV (Out of Band/out-of-band radiation, OOB) (Patent Document 1, Patent Document 2).

There are examples in which, in order to block OOB, a topcoat formed of a polyhydroxystyrene (PHS)-based compound, an acrylic compound, or other substances is applied to an overlayer on an EUV resist to reduce OOB (Non Patent Document 1), or a film of an EUV resolution enhancement layer is applied to an overlayer on an EUV resist to absorb OOB and improve the EUV resist resolution (Non Patent Document 2). However, what composition is most suitable is not described. A novolac-based material including a naphthalene ring is described as a resist overlayer film forming composition for EUV lithography (Patent Document 3).

As resist overlayer protective films that have hydrophobicity suitable for immersion lithography and can be dissolved in an aqueous alkaline solution, the following materials are described: a resist protecting film material including an acrylic polymer including a hexafluoroisopropyl alcohol group (Patent Document 4); a resist protecting film material including an ester compound having a fluoroalkyl group as a solvent (Patent Document 5); a photoresist overlayer film forming composition including a solvent having an ether structure (Patent Document 6); and a topcoat material including a hexafluoroalcohol unit and an alcohol-based solvent, which can be used as a topcoat for immersion process or a top anti-reflective coating (TARC) to be applied on the top surface of a photoresist (Patent Document 7).

A resist protecting film material is also described, which includes a polymer compound prepared by copolymerizing a repeating unit having a carboxy group and/or a sulfo group and a repeating unit including a hydrocarbon (Patent Document 8).

A method for forming a resist pattern is described, in which a polymer includes not less than 50 mol % of a unit structure including at least one of aromatic groups and heteroaromatic groups (Patent Document 9).

PRIOR ART DOCUMENTS

Patent Documents

Patent Document 1: Japanese Patent Application Publication No. 2004-348133
Patent Document 2: Japanese Patent Application Publication No. 2008-198788
Patent Document 3: International Publication No. WO2012/053302 Pamphlet
Patent Document 4: Japanese Patent Application Publication No. 2006-70244
Patent Document 5: Japanese Patent Application Publication No. 2007-241053
Patent Document 6: Japanese Patent Application Publication No. 2012-103738
Patent Document 7: Publication of Japanese Translation of PCT Application 2008-532067
Patent Document 8: Japanese Patent Application Publication No. 2008-065304
Patent Document 9: Japanese Patent Application Publication No. 2013-228663

Non Patent Documents

Non Patent Document 1: Shimizu, M., Maruyama, K., Kimura, T., Nakagawa, H., Sharma, S., "Development of Chemically Amplified EUV resist for 22 nm half pitch and beyond" Extreme Ultraviolet Lithography Symposium, Miami, (October, 2011)

Non Patent Document 2: Proc. of SPIE Vol. 7969 796916-1

SUMMARY OF THE INVENTION

Problem to be Solved by the Invention

As described above, particularly in exposure of EUV resists, UV light and DUV light are emitted together with EUV light from EUV light to emit. More specifically, the EUV light includes about 5% of light having wavelengths of 300 nm or lower in addition to EUV light. For example, the wavelength range from 180 nm to 300 nm, in particular, 180 nm to 260 nm or so, has the highest intensity, leading to lower sensitivity of EUV resists and degradation in pattern shape. With line widths of 22 nm or smaller, the effects of such UV light and DUV light (OUT of BAND/out-of-band radiation. OOB) appear to adversely affect the resolution of EUV resists.

In order to remove light having wavelengths from 180 nm to 260 nm or so, a filter may be installed in a lithography system, but this method makes the process complicated.

The present invention is made to provide an optimum resist overlayer film forming composition to solve these problems. A resist overlayer film forming composition for use in a lithography process in semiconductor device production is provided, in which the composition, as a resist overlayer film, in particular, as an overlayer film for an EUV resist, does not intermix with a resist, blocks undesirable exposure light particularly in EUV exposure, for example, UV and DUV and selectively transmits EUV alone, is excellent at blocking gas escaped from the resist, can be developed with a developer after exposure, and is applicable to either a positive resist or a negative resist.

Means for Solving the Problem

The present invention is as follows.

[1] A resist overlayer film forming composition comprising a polymer (P) including unit structures of Formula (1) and Formula (2) and having a weight average molecular weight, measured by gel permeation chromatography, of 500 to 2,000, and a $C_{8-16}$ ether compound as a solvent.

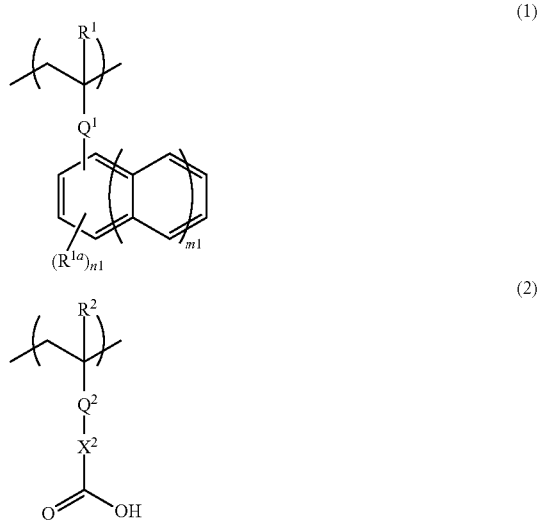

[In Formula (1) or Formula (2), $R^1$ and $R^2$ are the same or different and are each a hydrogen atom or a $C_{1-10}$ alkyl group;

$Q^2$ and $Q^2$ are the same or different and are each a single bond, an ester bond (—C(=O)—O— or —O—C(=O)—), or an amide bond (—NH—CO— or —CO—NH—):

$X^2$ is a single bond, a $C_{1-6}$ alkylene group, or a $C_{6-14}$ arylene group;

$R^{1a}$ is a $C_{1-10}$ alkyl group;

n1 is an integer of 1 to 3; and m1 is an integer of 0 to 2.]

[2] The composition according to [1], wherein the polymer (P) further includes a unit structure of Formula (3).

[In Formula (3), $R^3$ is a hydrogen atom or a $C_{1-10}$ alkyl group;

$Q^3$ is a single bond, an ester bond (—C(=O)—O— or —O—C(=O)—), or an amide bond (—NH—CO— or —CO—NH—);

$X^3$ is a single bond, a $C_{1-6}$ alkylene group, or a $C_{6-14}$ arylene group; and $R^{3a}$s are the same or different and are each a hydrogen atom, a $C_{1-10}$ alkyl group, or a $C_{1-4}$ acyl group.]

[3] The composition according to [1], wherein the polymer (P) further includes a unit structure of Formula (4).

[In Formula (4), $R^4$ is a hydrogen atom or a $C_{1-10}$ alkyl group;

$Q^4$ is a single bond, an ester bond (—C(=O)—O— or —O—C(=O)—), or an amide bond (—NH—CO— or —CO—NH—); and $R^{4a}$ is a $C_{1-10}$ alkyl group in which some or all of hydrogen atoms are optionally substituted with fluorine atoms, or a $C_{6-14}$ aryl group in which some or all of hydrogen atoms are optionally substituted with the alkyl groups.]

[4] The composition according to any one of [1] to [3], wherein the polymer (P) further includes the unit structures of Formulae (3) and (4).

[5] The composition according to [3] or [4], wherein the $R^{4a}$ includes a monovalent group of Formula (5):

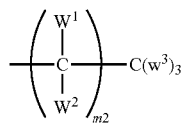 (5)

[in Formula (5), $W^1$ and $W^2$ are the same or different and are each a hydrogen atom, a fluorine atom, a trifluoromethyl group, a difluoromethyl group, or a monofluoromethyl group: three $w^3$s are each independently a hydrogen atom, a fluorine atom, or a combination of the hydrogen atom and the fluorine atom; at least one of $W^1$, $W^2$, and $w^3$, is a trifluoromethyl group, a difluoromethyl group, a monofluoromethyl group, or a fluorine atom; m2 is an integer of 0 to 9; and the maximum number of carbon atoms included in Formula (5) is 10.]

[6] The composition according to any one of [1] to [5], wherein the ether compound according to [1] is dibutyl ether, diisoamyl ether, diisobutyl ether, or a combination of dibutyl ether, diisoamyl ether, and diisobutyl ether.

[7] The composition according to any one of [1] to [6], wherein the ether compound according to [1] has a proportion, in the solvent according to [1], of not less than 87% by mass and not more than 100% by mass.

[8] The composition according to any one of [1] to [7], further comprising an acid compound.

[9] The composition according to [8], wherein the acid compound is a sulfonic acid compound or a sulfonic acid ester compound.

[10] The composition according to [8], wherein the acid compound is an onium salt-based acid generator, a halogen-containing compound-based acid generator, or a sulfonic acid-based acid generator.

[11] The composition according to any one of [1] to [10], further comprising a basic compound.

[12] The composition according to any one of [1] to [11], wherein a resist to be used with the composition is a resist for EUV (wavelength of 13.5 nm).

[13] A method for producing a semiconductor device, the method comprising: forming a resist film on a substrate; applying the resist overlayer film forming composition according to any one of [1] to [11] on the resist film and baking the composition to form a resist overlayer film; exposing the semiconductor substrate covered with the resist overlayer film and the resist film; and performing development after exposure to remove the resist overlayer film and the resist film.

[14] The method according to [13], wherein the exposure is performed with EUV (wavelength of 13.5 nm).

[15] A method for forming a resist pattern for use in production of a semiconductor device, the method comprising applying the resist overlayer film forming composition according to any one of [1] to [11] on a resist film formed on a semiconductor substrate and baking the composition to form a resist overlayer film.

[16] A method for producing the resist overlayer film forming composition according to any one of [1] to [11], the method comprising mixing the polymer (P) and a $C_{8-16}$ ether compound as a solvent.

Effects of the Invention

The present invention relates to a composition for forming a resist overlayer film, which, as a resist overlayer film forming composition, in particular, as an overlayer film forming composition for an EUV resist, forms a resist overlayer film that does not intermix with an EUV resist, blocks undesirable exposure light particularly in EUV exposure, for example, UV and DUV and selectively transmits EUV alone, and can be developed with a developer after exposure.

The composition according to the present invention contains an aromatic hydrocarbon ring that can absorb undesirable OOB of 180 am to 260 nm in DUV light included in EUV exposure light to improve the resolution of the EUV resist.

In particular, when the composition according to the present invention is used, specifically, when the polymer includes a benzene ring structure, a resist overlayer film having strong absorption in the vicinity of 200 nm can be formed. This resist overlayer film has the effect of suppressing excessive activation of a photo acid generator (PAG) present in the underlying resist, in addition to the absorption of OOB. This effect can suppress degradation of the resist pattern (for example, increase of the value of Line Width Roughness (LWR)) due to the excessive activation of the photo acid generator.

In particular, this effect is high when a triphenylsulfonium-based photo acid generator is present in the resist for EUV.

The resist overlayer film formed of the composition according to the present invention is excellent at blocking gas escaping from the resist, in particular, during EUV exposure and thus can prevent contamination of the exposure system by the escaping gas components.

The resist overlayer film forming composition according to the present invention includes a solvent having low solubility for a resist resin, that is, a solvent of $C_{8-16}$ having an ether bond (hereinafter also called ether-based solvent) and thus can be applied to a variety of resists, irrespective of resist types (positive or negative).

The polymer (P) to be used in the present invention includes a carboxy group according to the unit structure of Formula (2) and thus, in the case of general positive resists, can be dissolved with the resist in an alkaline developer during development after exposure. In this case, the composition including the polymer (P) can be dissolved away by an alkaline developer. Such a development process for positive resists is called positive tone development (PTD).

The polymer (P) to be used in the present invention can be dissolved in a development solvent (butyl acetate, 2-heptanone, or the like) to be used in a development process for general negative resists. Therefore, the composition including the polymer (P) can be dissolved away by the developer. Such a development process for negative resists is called negative tone development (NTD).

MODES FOR CARRYING OUT THE INVENTION

The resist overlayer film forming composition according to the present invention comprises a polymer (P) including unit structures of Formula (1) and Formula (2) described later and having a weight average molecular weight, measured by gel permeation chromatography (GPC), of 500 to 2,000, and a $C_{8-16}$ ether compound as a solvent.

The details of gel permeation chromatography will be described in Examples.

The details of the present invention will be described below.

(Resist Overlayer Film Forming Composition)

The resist overlayer film forming composition according to the present invention is mainly characterized by comprising a polymer (P) including unit structures of Formula (1) and Formula (2) and having a weight average molecular weight, measured by gel permeation chromatography, of 500 to 2,000, and a $C_{8-16}$ ether compound as a solvent.

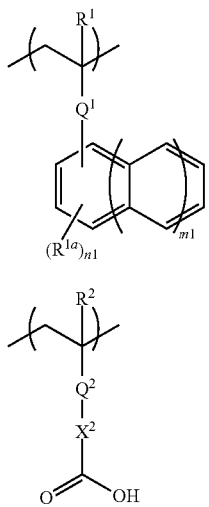

In Formula (1) or Formula (2), $R^1$ and $R^2$ are the same or different and are each a hydrogen atom or a $C_{1-10}$ alkyl group;

$Q^1$ and $Q^2$ are the same or different and are each a single bond, an ester bond (—C(=O)—O— or —O—C(=O)—) or an amide bond (—NH—CO— or —CO—NH—);

$X^2$ is a single bond, a $C_{1-6}$ alkylene group, or a $C_{6-14}$ arylene group;

$R^{1a}$ is a $C_{1-10}$ alkyl group;

n1 is an integer of 1 to 3; and m1 is an integer of 0 to 2.

The molar ratio of the unit structures of Formula (1) and Formula (2) to the entire polymer (P) is preferably the structural unit of Formula (1): 30 to 70 mol %
the structural unit of Formula (2): 20 to 50 mol %
with respect to the entire polymer (P).

The aromatic group in Formula (1) absorbs DUV light included in the EUV exposure light. The presence of $R^{1a}$ improves the solubility in an ether-based solvent. The carboxy group of Formula (2) is added in order to make the polymer (P) soluble in the alkaline aqueous solution when an alkaline aqueous solution is used in development after exposure of the resist.

Examples of the $C_{1-10}$ alkyl group include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, 1,1-diethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, 2-ethyl-3-methyl-cyclopropyl group, n-heptyl group, 1-methyl-n-heptyl group, n-octyl group, 1-methyl-n-octyl group, n-nonyl group, 1-methyl-n-nonyl group, and n-decanyl group.

Examples of the $C_{1-6}$ alkylene group include methylene group, ethylene group, n-propylene group, isopropylene group, cyclopropylene group, n-butylene group, isobutylene group, s-butylene group, t-butylene group, cyclobutylene group, 1-methyl-cyclopropylene group, 2-methyl-cyclopropylene group, n-pentylene group, 1-methyl-n-butylene group, 2-methyl-n-butylene group, 3-methyl-n-butylene group, 1,1-dimethyl-n-propylene group, 1,2-dimethyl-n-propylene group, 2,2-dimethyl-n-propylene group, 1-ethyl-n-propylene group, cyclopentylene group, 1-methyl-cyclobutylene group, 2-methyl-cyclobutylene group, 3-methyl-cyclobutylene group, 1,2-dimethyl-cyclopropylene group, 2,3-dimethyl-cyclopropylene group, 1-ethyl-cyclopropylene group, 2-ethyl-cyclopropylene group, n-hexylene group, 1-methyl-n-pentylene group, 2-methyl-n-pentylene group, 3-methyl-n-pentylene group, 4-methyl-n-pentylene group, 1,1-dimethyl-n-butylene group, 1,2-dimethyl-n-butylene group, 1,3-dimethyl-n-butylene group, 2,2-dimethyl-n-butylene group, 2,3-dimethyl-n-butylene group, 3,3-dimethyl-n-butylene group, 1-ethyl-n-butylene group, 2-ethyl-n-butylene group, 1,1,2-trimethyl-n-propylene group, 1,2,2-trimethyl-n-propylene group, 1-ethyl-1-methyl-n-propylene group, 1-ethyl-2-methyl-n-propylene group, cyclohexylene group, 1-methyl-cyclopentylene group, 2-methyl-cyclopentylene group, 3-methyl-cyclopentylene group, 1-ethyl-cyclobutylene group, 2-ethyl-cyclobutylene group, 3-ethyl-cyclobutylene group, 1,2-dimethyl-cyclobutylene group, 1,3-dimethyl-cyclobutylene group, 2,2-dimethyl-cyclobutylene group, 2,3-dimethyl-cyclobutylene group, 2,4-dimethyl-cyclobutylene group, 3,3-dimethyl-cyclobutylene group, 1-n-propyl-cyclopropylene group, 2-n-propyl-cyclopropylene group, 1-isopropyl-cyclopropylene group, 2-isopropyl-cyclopropylene group, 1,2,2-trimethyl-cyclopropylene group, 1,2,3-trimethyl-cyclopropylene group, 2,2,3-trimethyl-cyclopropylene group, 1-ethyl-2-methyl-cyclopropylene group, 2-ethyl-1-methyl-cyclopropylene group, 2-ethyl-2-methyl-cyclopropylene group, and 2-ethyl-3-methyl-cyclopropylene group.

Examples of the $C_{6-14}$ arylene group include phenylene group, naphthylene group, anthracenylene group, and biphenylene group.

$Q^1$ and $Q^2$ are preferably the same or different and are each a single bond or an ester bond (—C(=O)—O— or —O—C(=O)—).

$R^1$ and $R^2$ are preferably selected from a hydrogen atom, methyl group, ethyl group, n-propyl group, i-propyl group, n-butyl group, i-butyl group, s-butyl group, t-butyl group, and 1,1-diethyl-n-propyl group, more preferably selected from a hydrogen atom, methyl group, and ethyl group.

$X^2$ is preferably a single bond, a methylene group, an ethylene group, an n-propylene group, an n-butylene group, a phenylene group, or a biphenylene group.

$R^{1a}$ is preferably methyl group, ethyl group, n-propyl group, i-propyl group, n-butyl group, i-butyl group, s-butyl group, t-butyl group, n-pentyl group, n-hexyl group, 1-methyl n-hexyl group, n-heptyl group, n-octyl group, n-nonyl group, n-decanyl group, 1,1-diethyl-n-propyl group, 2-methyl-n-propyl group, or 2,2'-dimethyl-n-propyl group.

m1 is preferably 0, in terms of preventing excessive activation of the photo acid generator present in the resist to form a satisfactory resist pattern, for the foregoing reason, and in terms of production costs of the polymer (P).

The solvent used in the composition according to the present invention is a $C_{8-16}$ ether compound (ether-based solvent). When a resist overlayer film is applied on an EUV resist, rather than using a solvent usually used for EUV resists, a solvent of $C_{8-16}$ having an ether bond (ether-based solvent) is preferably used as a solvent included in the resist overlayer film forming composition in order to prevent intermixing with the EUV resist (mixing of the layers).

The ether-based solvent has low solubility for a resin that forms a resist, irrespective of the kinds of resin (for example, methacrylate-based resins, PHS-based resins, hybrids containing both of methacrylate and hydroxystyrene (HS)).

The $C_{8-16}$ ether compound (ether-based solvent) as a solvent used in the composition according to the present invention is a compound of Formula (6).

$$A_1\text{-O-}A_2 \qquad (6)$$

In Formula (6), $A_1$ and $A_2$ are each independent and an optionally substituted linear, branched, or cyclic saturated alkyl group having a carbon atom number of 1 to 15.

Examples of the linear, branched, or cyclic saturated alkyl group having a carbon atom number of 1 to 15 include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, n-hexyl group, n-heptyl group, n-octyl group, n-nonyl group, n-decanyl group, n-undecanyl group, n-dodecanyl group, n-tridecanyl group, n-tetradecanyl group, n-pentadecanyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Among those, examples of preferred solvents include dibutyl ether, diisobutyl ether, di-tert-butyl ether, dipentyl ether, diisoamyl ether, dihexyl ether, dioctyl ether, and cyclopentyl methyl ether, which have a good balance between the solubility of the polymer (P) and the insolubility of the resist. Further preferable solvents are dibutyl ether, diisobutyl ether, and diisoamyl ether, and a particularly preferable solvent is diisoamyl ether. These ether-based solvents can be used singly or in the form of a mixture.

The proportion of the ether solvent in the solvent in the composition according to the present invention is preferably 100% by mass, but may be 90% by mass or more to 100% by mass, or may be 87% by mass or more to 100% by mass.

The higher the ether-based solvent content is, the higher the effect of suppressing intermixing with the resist is.

In addition to the ether-based solvent, an alcohol-based solvent below or water may be mixed, if necessary.

Examples of saturated alkyl alcohols include 1-butanol, 2-butanol, isobutyl alcohol, tert-butyl alcohol, 1-pentanol, 2-pentanol, 3-pentanol, 1-heptanol, 2-heptanol, tert-amyl alcohol, neopentyl alcohol, 2-methyl-1-propanol, 2-methyl-1-butanol, 2-methyl-2-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-butoxy-2-propanol, and cyclohexanol.

Examples of aromatic alcohols include 1-phenylpropanol, 2-phenylpropanol, 3-phenylpropanol, 2-phenoxyethanol, phenethyl alcohol, and styralyl alcohol.

Those alcohol-based solvents or water may be used singly or in combination of two or more of them. The ratio of the other solvents above to be added is 0.01% to 13% by mass to the ether-based solvent.

For convenience of synthesis of the polymer (P) for use in the present invention, for example, organic solvents below may be mixed together with the ether-based solvent. Examples of the solvents include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents may be used singly or in combination of two or more of them. The ratio of the other solvents above to be added is 0.01% to 13% by mass with respect to the solvent of $C_{8-16}$ having an ether bond.

The polymer (P) preferably includes a unit structure of Formula (3), if necessary, in addition to Formula (1) and Formula (2).

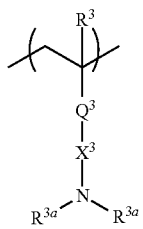

(3)

In Formula (3),
$R^3$ is a hydrogen atom or a $C_{1-10}$ alkyl group;
$Q^3$ is a single bond, an ester bond (—C(=O)—O— or —O—C(=O)—), or an amide bond (—NH—CO— or —CO—NH—);
$X^3$ is a single bond, a $C_{1-6}$ alkylene group, or a $C_{6-14}$ arylene group; and
$R^{3a}$s are the same or different and are each a hydrogen atom, a $C_{1-10}$ alkyl group, or a $C_{1-4}$ acyl group.

Examples of the $C_{1-10}$ alkyl group include the alkyl groups listed above.

Examples of the $C_{1-6}$ alkylene group include the alkylene groups listed above.

Examples of the $C_{6-14}$ arylene group include the arylene groups listed above.

Examples of the $C_{1-4}$ acyl group include methanoyl group, ethanoyl group, propanoyl group, and butanoyl group.

$R^3$ is preferably a hydrogen atom, methyl group, ethyl group, n-propyl group, i-propyl group, n-butyl group, i-butyl group, s-butyl group, or t-butyl group, particularly preferably a hydrogen atom, methyl group, or ethyl group.

$Q^3$ is preferably a single bond or an ester bond (—C(=O)—O— or —O—C(=O)—).

$X^3$ is preferably a single bond, a methylene group, an ethylene group, an n-propylene group, or an n-butylene group.

$R^{3a}$ is preferably a combination selected from a hydrogen atom, methyl group, ethyl group, n-propyl group, i-propyl group, n-butyl group, i-butyl group, s-butyl group, t-butyl group, 1-methyl-n-butyl group, 2-methyl-n-butyl group, and 3-methyl-n-butyl group, 1-methyl-n-propyl group, 2-methyl-n-propyl group, methanoyl group, and ethanoyl group.

The polymer (P) having the unit structure of Formula (3) can adjust the shape of the resist by the property of basicity of its side chain. More specifically, the interaction with the acid present in the resist underlying the composition according to the present invention enables the resist shape after exposure and development to be controlled (the resist shape after exposure and development is preferably rectangular). The composition according to the present invention comprising the polymer (P) including the unit structure of Formula (3) can be used as it is, without subsequently adding a basic compound to be described later, to control the resist shape well. However, a basic compound may be further included, if necessary, in the composition including the polymer (P) having the unit structure of Formula (3).

The molar ratio of the unit structure of Formula (3) to the entire polymer (P) therefore need not be high, and is 0.1 to 50 mol % with respect to the entire polymer (P), further preferably 0.1 to 30 mol %, further preferably 0.1 to 20 mol %, further preferably 0.1 to 10 mol %.

The polymer (P) preferably includes a unit structure of Formula (4), if necessary, in addition to Formula (1) and Formula (2).

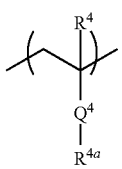

(4)

In Formula (4),
$R^4$ is a hydrogen atom or a $C_{1-10}$ alkyl group;
$Q^4$ is a single bond, an ester bond (—C(=O)—O— or —O—C(=O)—), or an amide bond (—NH—CO— or —CO—NH—); and
$R^{4a}$ is a $C_{1-10}$ alkyl group in which some or all of hydrogen atoms are optionally substituted with fluorine atoms, or a $C_{6-14}$ aryl group in which some or all of hydrogen atoms are optionally substituted with the alkyl groups.

As used herein, "the alkyl group" refers to "a $C_{1-10}$ alkyl group in which some or all of hydrogen atoms are optionally substituted with fluorine atoms".

Examples of the $C_{1-10}$ alkyl group include the alkyl groups listed above, and some or all of hydrogen atoms of the alkyl group are optionally substituted with fluorine atoms.

Examples of the $C_{6-14}$ aryl group include phenyl group, benzyl group, naphthyl group, anthracenyl group, and biphenyl group.

$R^4$ is preferably a hydrogen atom, methyl group, ethyl group, n-propyl group, i-propyl group, n-butyl group, i-butyl group, s-butyl group, or t-butyl group, particularly preferably, a hydrogen atom, methyl group, or ethyl group.

$Q^4$ is preferably a single bond or an ester bond (—C(=O)—O— or —O—C(=O)—).

$R^{4a}$ is preferably a monovalent organic group structure including a fluorine atom of Formula (5) below, a mono(trifluoromethyl)phenyl group, or a bis(trifluoromethyl)phenyl group.

Formula (5):

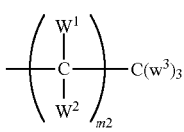

(5)

in Formula (5),
$W^1$ and $W^2$ are the same or different and are each a hydrogen atom, a fluorine atom, a trifluoromethyl group, a difluoromethyl group, or a monofluoromethyl group; three $w^3$s are each independently a hydrogen atom, a fluorine atom, or a combination of the hydrogen atom and the fluorine atom; at least one of $W^1$, $W^2$, and $w^3$ is a trifluoromethyl group, a difluoromethyl group, a monofluoromethyl group, or a fluorine atom; m2 is an integer of 0 to 9; and the maximum number of carbon atoms included in Formula (5) is 10.

Specific examples of the structure of Formula (5) are Formula (5-1) to Formula (5-20).

| | |
|---|---|
| —CF$_3$ | (Formula 5-1) |
| —C(CF$_3$)$_3$ | (Formula 5-2) |
| —CH$_2$CF$_3$ | (Formula 5-3) |
| —CH(CF$_3$)$_2$ | (Formula 5-4) |
| —CH$_2$CF$_2$CF$_3$ | (Formula 5-5) |
| —(CH$_2$)$_2$(CF$_2$)$_2$CF$_3$ | (Formula 5-6) |
| —CH$_2$(CF$_2$)$_2$CF$_3$ | (Formula 5-7) |
| —(CH$_2$)$_2$(CF$_2$)$_4$CF$_3$ | (Formula 5-8) |
| —(CH$_2$)$_2$(CF$_2$)$_6$CF$_3$ | (Formula 5-9) |
| —(CH$_2$)$_2$(CF$_2$)$_6$CF$_3$ | (Formula 5-10) |
| —C(CF$_3$)$_2$(CF$_2$)$_2$CF$_3$ | (Formula 5-11) |
| —C(CF$_3$)$_2$(CF$_2$)$_2$CHF$_2$ | (Formula 5-12) |
| —C(CF$_3$)$_2$(CF$_2$)$_2$CH$_2$F | (Formula 5-13) |
| —C(CH$_3$)(CF$_3$)(CF$_2$)$_2$CF$_3$ | (Formula 5-14) |
| —CF$_2$CF$_3$ | (Formula 5-15) |
| —(CF$_2$)$_2$CF$_3$ | (Formula 5-16) |
| —(CF$_2$)$_3$CF$_3$ | (Formula 5-17) |
| —(CF$_2$)$_4$CF$_3$ | (Formula 5-18) |
| —(CF$_2$)$_5$CF$_3$ | (Formula 5-19) |
| —(CF$_2$)$_9$CF$_3$ | (Formula 5-20) |

Among those, the structures of Formula (5-1) to Formula (5-7) or Formula (5-15) to Formula (5-17) are particularly preferred.

The unit structure of Formula (4) is added in order to improve the resist shape control and/or the solubility of the polymer (P) in the ether-based solvent. It has been found that, in particular, in the case of negative resists, secondary electrons to be generated from the side chain of R$^{4a}$ due to radiation of EUV light are effective in the resist shape control.

When the composition according to the present invention is used as an overlayer film for the EUV resist, the unit structure of Formula (4) includes fluorine atoms, and fluorine atoms are known to absorb EUV light. It is therefore undesirable that the polymer (P) includes a high proportion of the unit structure of Formula (4). The molar ratio of Formula (4) to the entire polymer (P) is 0.1 to 40 mol %, preferably 0.1 to 30 mol %, further preferably 0.1 to 20 mol %, and further preferably 0.1 to 10 mol %, with respect to the entire polymer (P).

In the composition according to the present invention, the polymer (P) preferably further includes the unit structures of Formula (3) and Formula (4), if necessary, for the reason as described above, in addition to Formula (1) and Formula (2).

(Method for Producing Polymer (P))

A method for producing the polymer (P) having a unit structure described above will be detailed below.

A method for producing the polymer (P) used in the present invention includes the step of reacting compounds of Formula (1-a) and Formula (2-a), preferably, in proportions of:

the compound of Formula (1-a): 30 to 70 mol % the compound of Formula (2-a): 20 to 50 mol % with respect to the entire polymer (P), in a solvent for reaction.

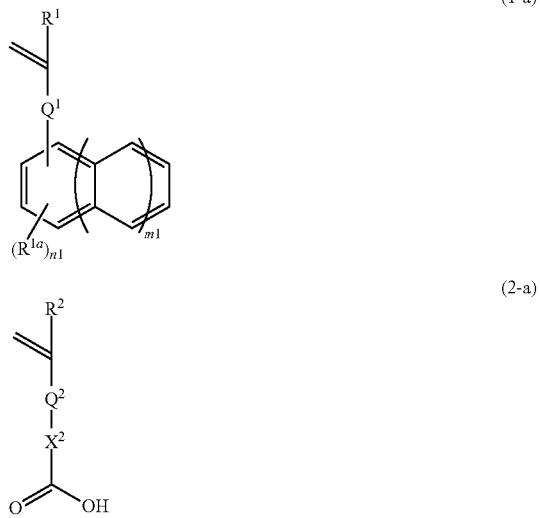

In Formula (1-a) or Formula (2-a), the definitions of R$^1$, R$^2$, X$^1$, X$^2$, R$^1$, n1, and m1, and the preferable ranges are as described above.

Specific examples of the preferable compound of Formula (1-a) include Formula (1-1) to Formula (1-33).

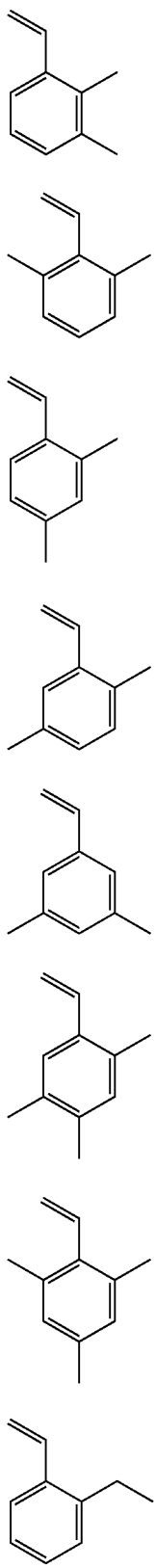
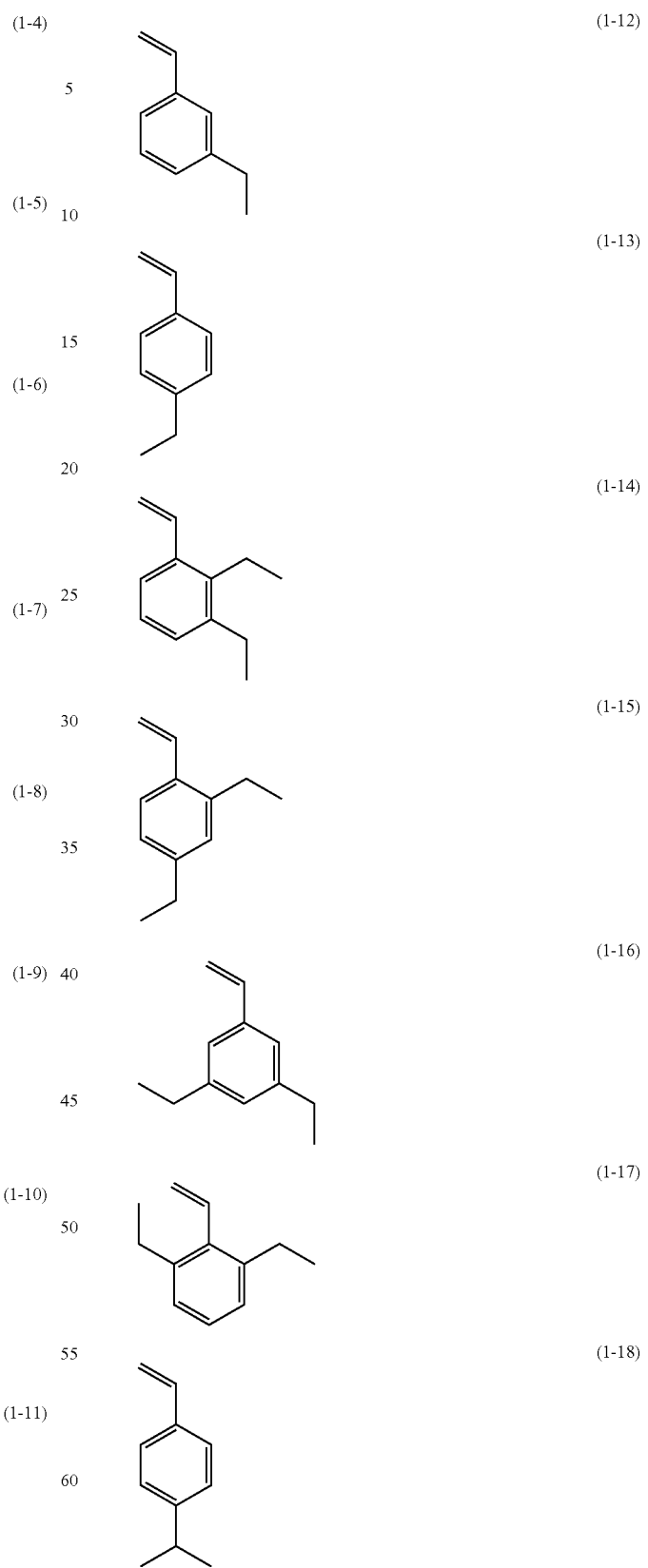

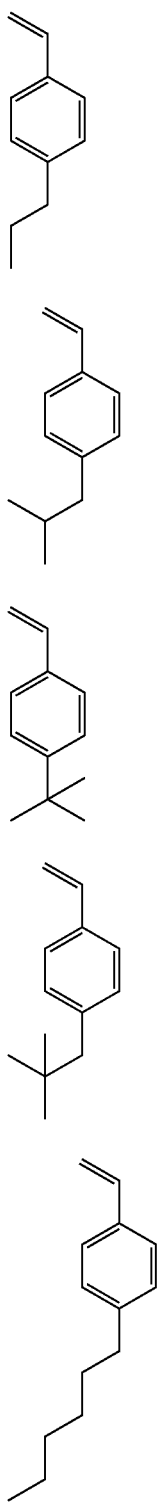
(1-19)
(1-20)
(1-21)
(1-22)
(1-23)
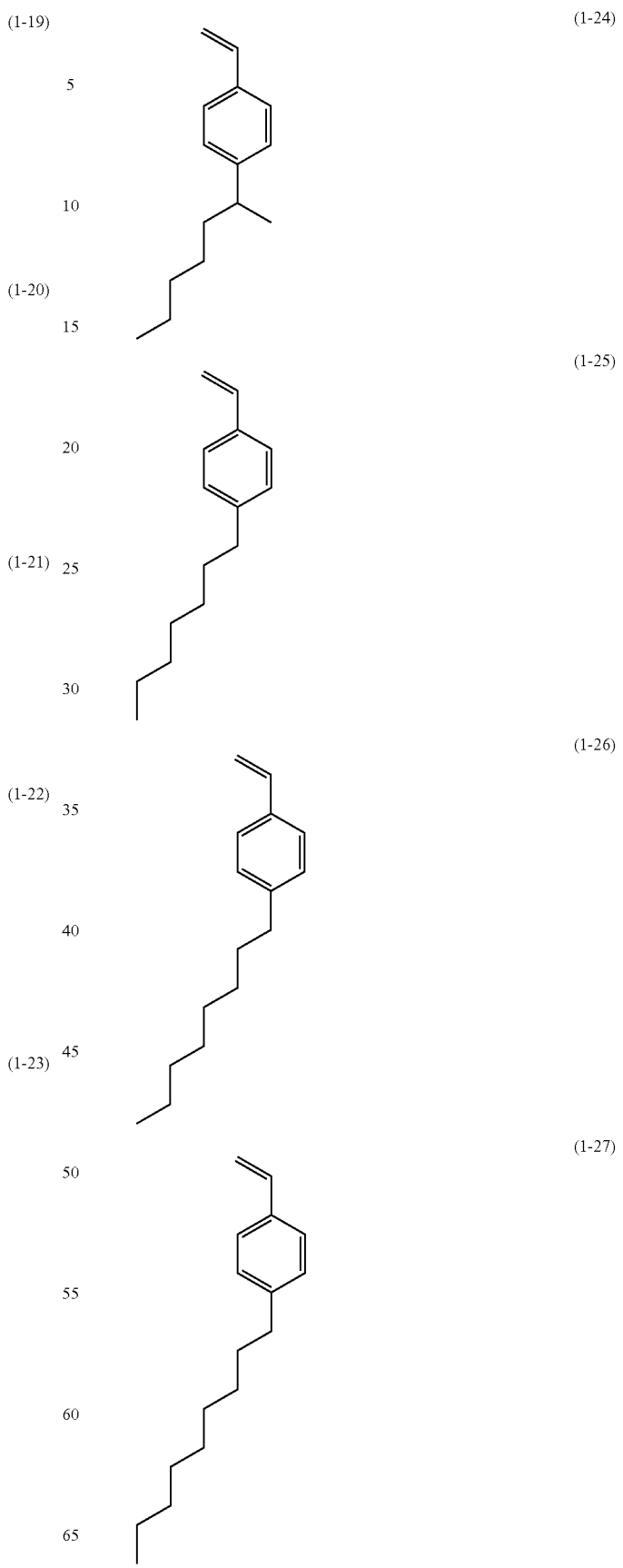
(1-24)
(1-25)
(1-26)
(1-27)

(1-28)
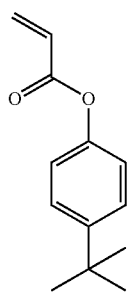

(1-29)
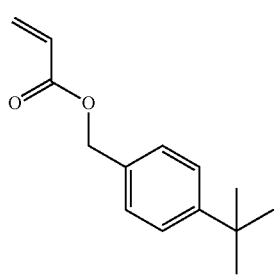

(1-30)
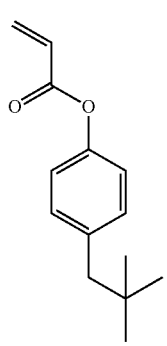

(1-31)
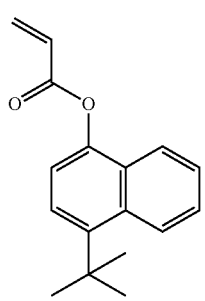

(1-32)
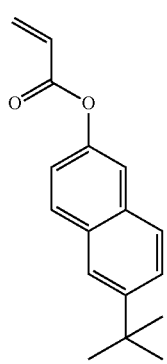

(1-33)
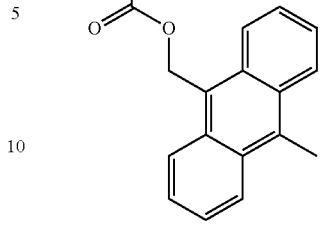

Specific examples of the preferable compound of Formula (2-a) include Formula (2-1) to Formula (2-4).

(2-1)

(2-2)
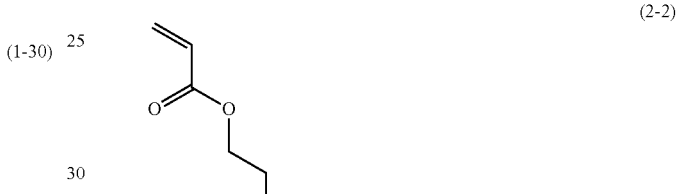

(2-3)
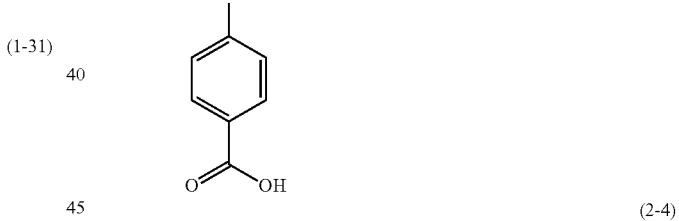

(2-4)
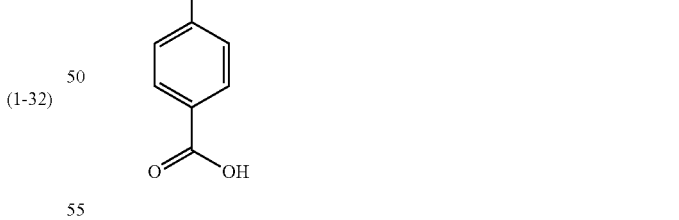

The method for producing the polymer (P) includes the step of reacting a compound of Formula (1-a) and Formula (2-a), and further a compound of Formula (3-a) or/and Formula (4-a), if necessary, preferably in proportions of:

the compound of Formula (1-a): 30 to 7 mol the compound of Formula (2-a): 20 to 50 mol % the compound of Formula (3-a) or/and Formula (4-a): 0.1 to 40 mol % with respect to the entire polymer (P), in a solvent for reaction.

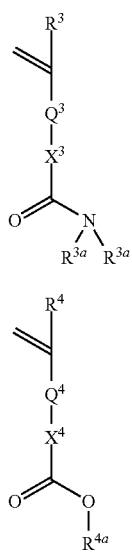
(3-a)
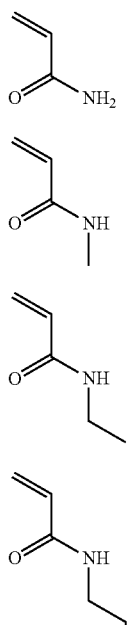
(4-a)
In Formula (3-a) or Formula (4-a),
the definitions of $R^3$, $R^4$, $X^3$, $X^4$, $R^{3a}$, and $R^{4a}$, and the preferable ranges are as described above.
Specific examples of the preferable compound of Formula (3-a) include Formula (3-1) to Formula (3-20).
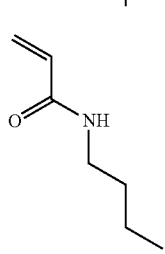
(3-1)
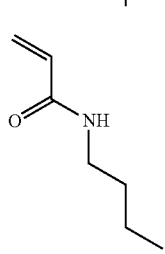
(3-2)
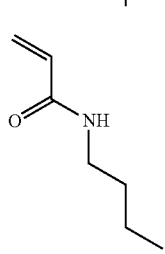
(3-3)
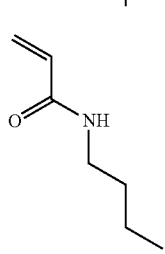
(3-4)
(3-5)
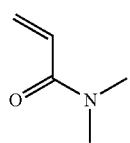
(3-6)
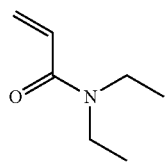
(3-7)
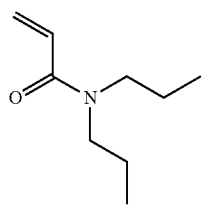
(3-8)
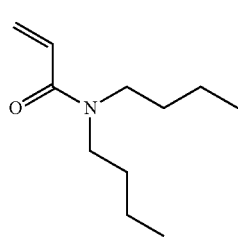
(3-9)
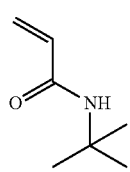
(3-10)
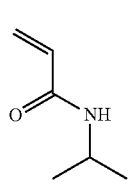
(3-11)
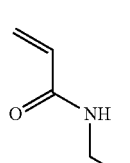
(3-12)
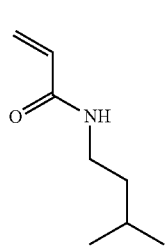
(3-13)

(3-14)
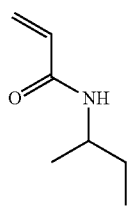
(3-15)
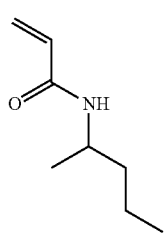
(3-16)
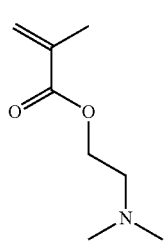
(3-17)
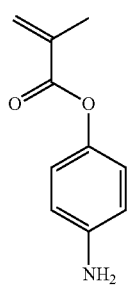
(3-18)
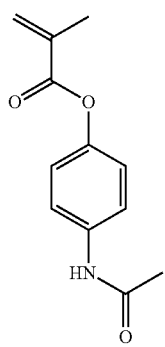
(3-19)
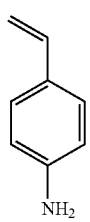
(3-20)
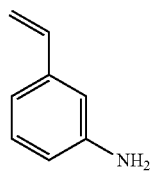
Specific examples of the preferable compound of Formula (4-a) include Formula (4-1) to Formula (4-11).
(4-1)
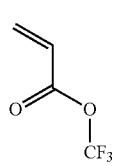
(4-2)
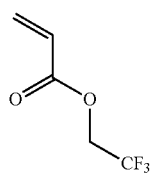
(4-3)
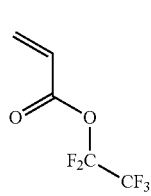
(4-4)
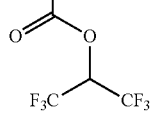
(4-5)
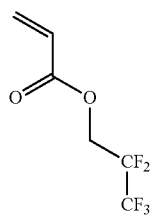
(4-6)
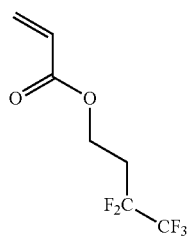

(4-7)

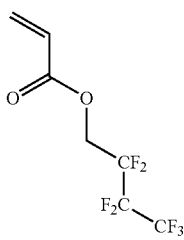

(4-8)

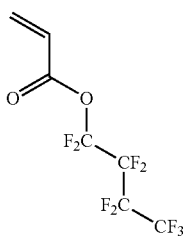

(4-9)

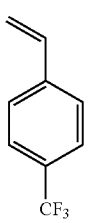

(4-10)

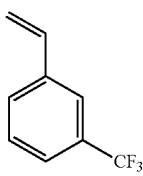

(4-11)

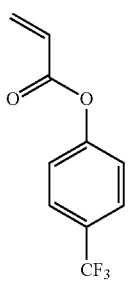

The polymer (P) can be synthesized by radical polymerization, anionic polymerization, cationic polymerization, or other methods, which are known methods for synthesizing acrylic polymers or methacrylic polymers. In this method, a variety of methods including known methods of solution polymerization, suspension polymerization, emulsion polymerization, and mass polymerization can be employed.

Examples of the polymerization initiator for use in polymerization include 2,2'-azobis(isobutyronitrile), 2,2'-azobis(2-methylbutyronitrile), 2,2'-azobis(2,4-dimethylvaleronitrile), 4,4'-azobis(4-cyanovaleric acid), 2,2'-azobis(2,4-dimethylvaleronitrile), 2,2'-azobis(4-methoxy-2,4-dimethylvaleronitrile), 2,2'-azobis(isobutyronitrile), 1,1'-azobis(cyclohexane-1-carbonitrile), 1-[(1-cyano-1-methylethyl)azo]formamide, 2,2'-azobis[2-(2-imidazoline-2-yl)propane]dihydrochloride, 2,2'-azobis[2-(2-imidazoline-2-yl)propane], and 2,2'-azobis(2-methylpropionamidine)dihydrochloride.

Examples of the solvent for use in polymerization include dioxane, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These may be used singly or by mixing with each other.

Ethyl lactate is preferably used as the solvent for reaction of the polymer (P) in the composition according to the present invention.

A stirring reaction is performed under reaction conditions of 50° C. to 200° C. for 1 hour to 48 hours to yield the polymer (P) used in the present invention.

The solution including the polymer (P) thus obtained can be used as it is in preparation of the resist overlayer film forming composition. The polymer (P) may be precipitated and isolated in a poor solvent such as methanol, ethanol, ethyl acetate, hexane, toluene, acetonitrile, and water, or a solvent mixture thereof, and collected therefrom to be used.

A water/methanol mixed solvent is preferably used as the solvent for precipitation of the polymer (P) to be used in the present invention.

After being isolated, the polymer (P) may be re-dissolved as it is in the solvent to be used in the composition according to the present invention, or may be dried to be used. When the polymer (P) is dried, the preferable drying conditions are 30° C. to 100° C. for 6 to 48 hours in an oven or the like.

After being collected, the polymer (P) may be re-dissolved in the ether-based solvent and prepared as the composition according to the present invention, and can be used as the resist overlayer film forming composition.

The weight average molecular weight of the polymer (P) to be used in the present invention as determined by gel permeation chromatography (GPC) is, for example, 500 to 2,000 in terms of polystyrene, although it varies depending on the solvent to be used, the solution viscosity, and the like. When the weight average molecular weight is 500 or less, the polymer (P) may diffuse into the photoresist to deteriorate the lithography performance. When the weight average molecular weight is 2,000 or more, the solubility in the ether solvent is insufficient, and stable composition according to the present invention cannot be formed. The solubility of the resist overlayer film to be formed in a photoresist developer is also insufficient to cause residue after development to be formed or to result in poor development (the pattern fails to be formed due to the left film).

The content of the polymer (P) in the solid content in the composition is 20% by mass or more, for example 20 to 100% by mass, or 30 to 100% by mass. The solid content of the composition according to the present invention is 0.1 to 50% by mass, preferably 0.3 to 30% by mass. The solid content is obtained by removing the solvent component from the resist overlayer film forming composition.

The composition of the present invention may further include an acid compound, a basic compound, a surfactant, a rheology control agent, and other substances.

The resist overlayer film forming composition of the present invention may further include an acid compound in order to match the acidity with that of the underlying resist in the lithography process. A sulfonic acid compound or a sulfonic acid ester compound may be used as the acid compound. For example, it is possible to blend an acid compound such as bis(4-hydroxyphenyl) sulfone, p-toluenesulfonic acid, trifluoromethanesulfonic acid, pyridinium p-toluenesulfonic acid, salicylic acid, sulfosalicylic acid, citric acid, benzoic acid, and hydroxybenzoic acid, and/or a thermal acid generator such as 2,4,4,6-tetrabromocyclohexadienone, benzoin tosylate, and 2-nitrobenzyl tosylate. The amount to be blended is 0.02% to 10% by mass, preferably 0.04% to 5% by mass relative to 100% by mass of the total solid content.

The resist overlayer film forming composition of the present invention may include an acid generator that generates an acid by exposure light (for example, ArF excimer laser radiation, EUV radiation, and electron beam radiation) in order to match the acidity to that of the underlying resist in the lithography process. Preferred examples of the acid generator include: onium salt-based acid generators such as bis(4-tert-butylphenyl)iodonium trifluoromethanesulfonate and triphenylsulfonium trifluoromethanesulfonate; halogen-containing compound-based acid generators such as phenyl-bis(trichloromethyl)-s-triazine; and sulfonic acid-based acid generators such as benzoin tosylate and N-hydroxysuccinimide trifluoromethanesulfonate. The amount of the acid generator to be added is 0.02% to 10% by mass and preferably 0.04% to 5% by mass relative to 100% by mass of the total solid content.

The resist overlayer film forming composition of the present invention may include a basic compound. The basic compound is added to enable sensitivity to be controlled during exposure of the resist. That is, the basic compound such as amine reacts with acids generated by a photo acid generator during exposure to reduce the sensitivity of the resist underlayer film, so that the shape of the top portion of the resist after exposure development can be controlled (the resist after exposure and development is preferably rectangular).

Examples of the basic compound include the known amine compounds described below.

Examples of amine compounds include ammonia, tetramethylammonium hydroxide, tetraethylammonium hydroxide, tetrapropylammonium hydroxide, tetrabutylammonium hydroxide, 2-(dimethylamino)ethanol, 2,2,2-trifluoroethylamine, and 4-methylmorpholine.

Another example is an aminobenzene compound of Formula (13-1).

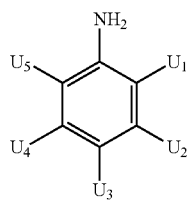

(13-1)

In Formula (13-1), $U_1$ to $U_5$ each are a hydrogen atom, a $C_{1-10}$ alkyl group, or an amino group.

Examples of the $C_{1-10}$ alkyl group include the above-described alkyl group, and preferred examples include methyl group, ethyl group, or isopropyl group.

Examples of the compound are, for example, Formula (13-2) to Formula (13-47).

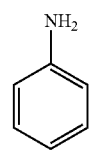

(13-2)

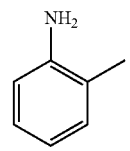

(13-3)

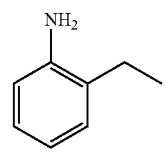

(13-4)

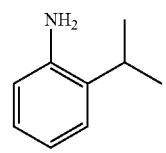

(13-5)

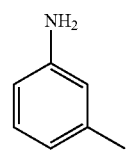

(13-6)

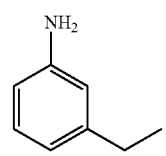

(13-7)

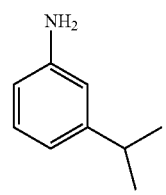

(13-8)

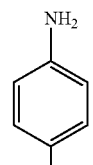

(13-9)

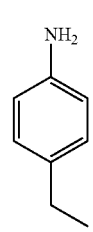

(13-10)

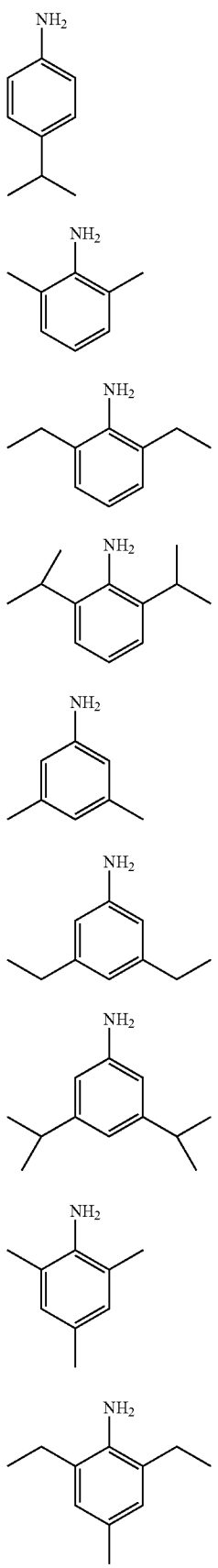
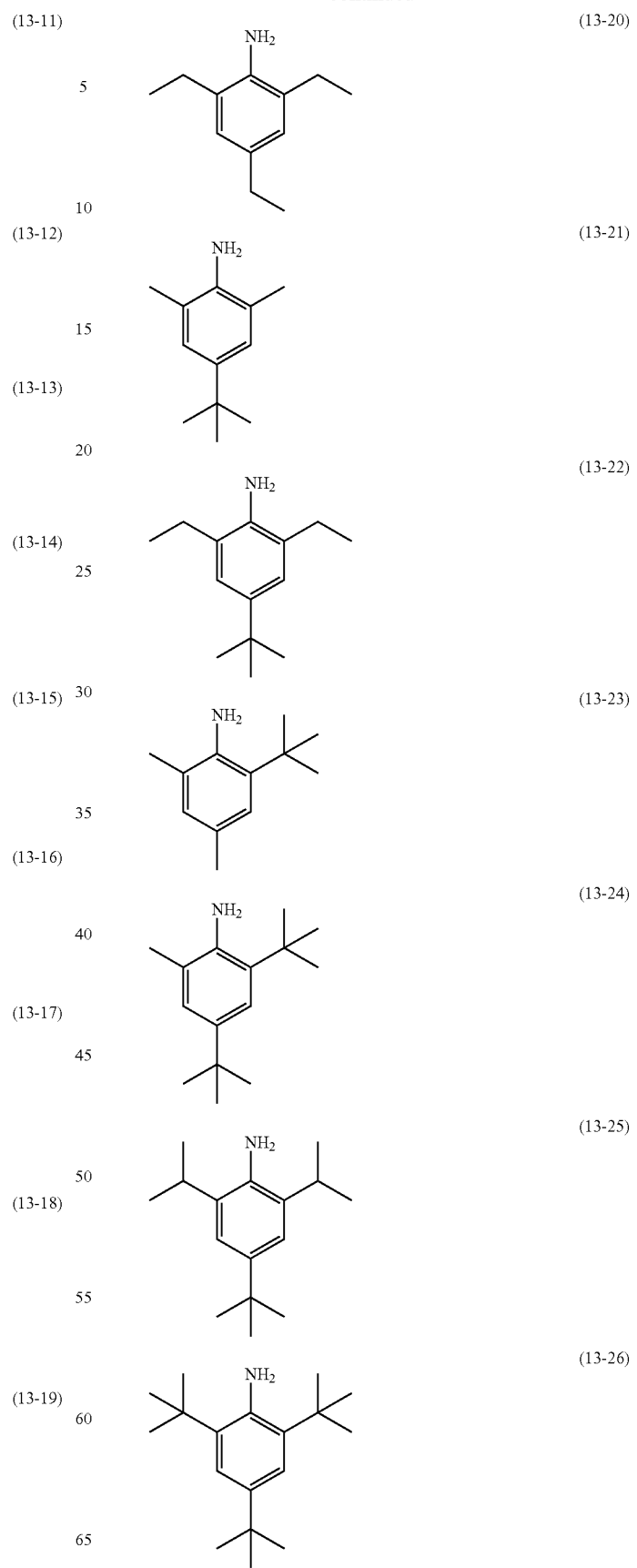

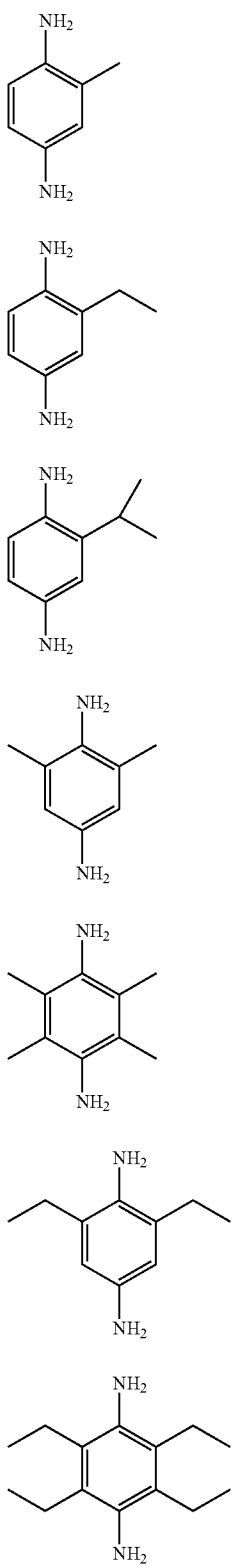
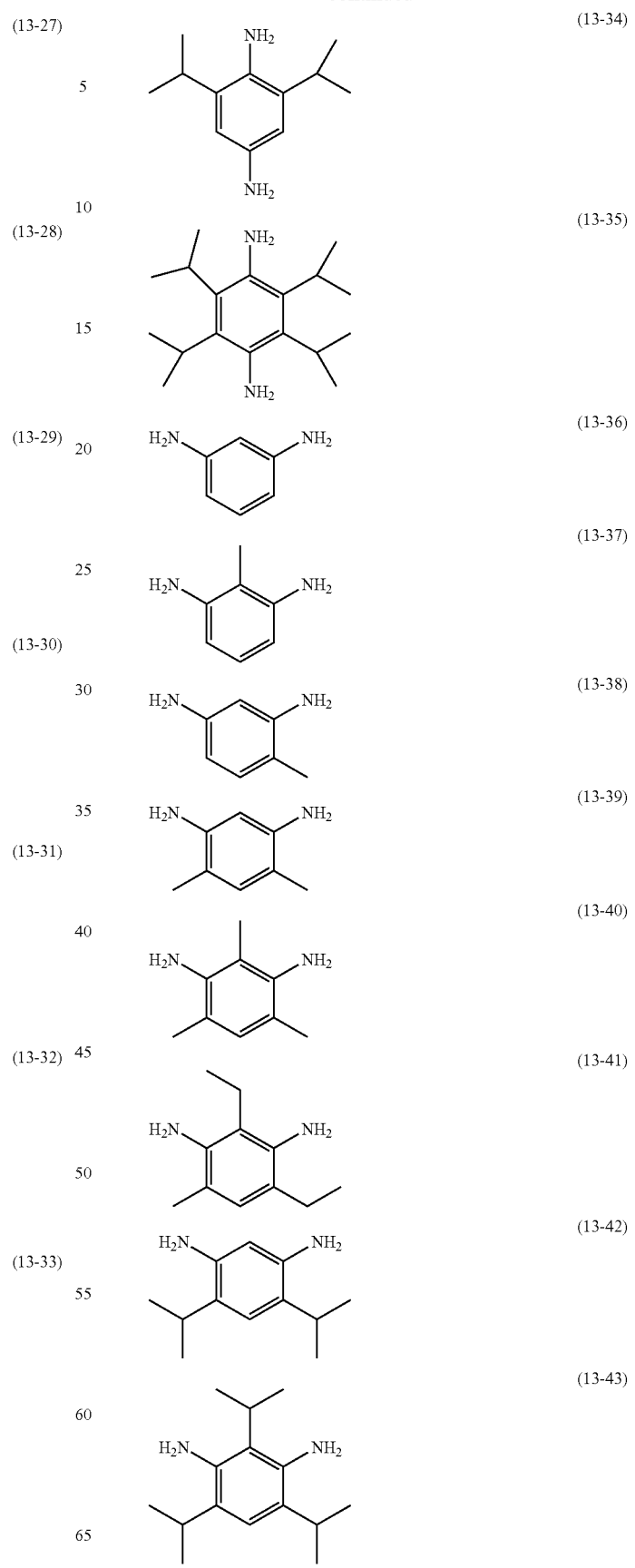

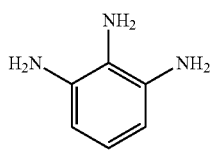
(13-44)

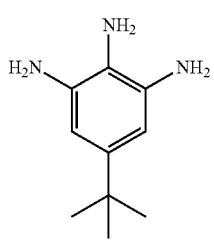
(13-46)

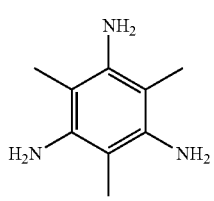
(13-47)

Examples include tertiary amines such as triethanolamine, tributanolamine, trimethylamine, triethylamine, trinormalpropylamine, triisopropylamine, trinormalbutylamine, tri-tert-butylamine, trinormaloctylamine, triisopropanolamine, phenyldiethanolamine, stearyldiethanolamine, and diazabicyclooctane, and aromatic amines such as pyridine and 4-dimethylaminopyridine. Other examples include primary amines such as benzylamine and normalbutylamine, and secondary amines such as diethylamine and dinormalbutylamine. These compounds may be used singly or in combination of two or more of them.

The composition of the present invention may further include a rheology control agent, a surfactant, or other additives as necessary in addition to the above compounds.

The rheology control agent is added mainly in order to improve flowability of the composition of the present invention. Specific examples include: phthalic acid derivatives such as dimethyl phthalate, diethyl phthalate, diisobutyl phthalate, dihexyl phthalate, and butyl isodecyl phthalate; adipic acid derivatives such as di-n-butyl adipate, diisobutyl adipate, diisooctyl adipate, and octyl decyl adipate; maleic acid derivatives such as di-n-butyl maleate, diethyl maleate, and dinonyl maleate; oleic acid derivatives such as methyl oleate, butyl oleate, and tetrahydrofurfuryl oleate; and stearic acid derivatives such as n-butyl stearate and glyceryl stearate.

The ratio of these rheology control agents to be blended is generally less than 30% by mass with respect to 100% by mass of the total composition of the composition of the present invention.

The composition of the present invention may further include a surfactant in order not to generate pinholes, striations, and other defects and to further improve the coating properties against surface irregularities. Examples of the surfactant include: nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorosurfactants such as EFTOP EF301, EF303, and EF352 (manufactured by Tochem Products), MEGAFAC F171 and F173 (manufactured by DIC Corporation), Fluorad FC430 and FC431 (manufactured by Sumitomo 3M Ltd.), Asahiguard AG710, Surflon S-382, SC101, SC102, SC103, SC104, SC105, and SC106 (manufactured by Asahi Glass Co., Ltd.), and Fluorinated Mold Release Agents series (manufactured by NEOS COMPANY LIMITED); and organosiloxane polymer KP341 (manufactured by Shin-Etsu Chemical Co., Ltd.).

The amount of these surfactants to be blended is generally not more than 0.2% by mass and preferably not more than 0.1% by mass relative to 100% by mass of the total composition of the composition of the present invention. These surfactants may be added singly or in combination of two or more of them.

(Method for Producing Resist Overlayer Film Forming Composition of the Present Invention)

The resist overlayer film forming composition according to the present invention can be produced by mixing the polymer (P) and a $C_{8-16}$ ether compound as a solvent according to the composition, for example, mixing with stirring at room temperature to 40° C.

(Resist to be Used with Composition of the Present Invention)

The resist to be used with the composition according to the present invention may be any of those for KrF (wavelength 248 nm), ArF (wavelength 193 nm), EUV (wavelength 13.5 nm), or electron beams (EB). The resists for EUV (wavelength 13.5 nm) and electron beams (EB) are preferable, and the resist for EUV (wavelength 13.5 nm) is further preferable.

With the resist for EUV (wavelength 13.5 nm), the composition according to the present invention has the excellent effects such as reducing OOB, improving lithography performance of the resist, and reducing outgas, as described above.

The EUV resist to be applied underneath the resist overlayer film in the present invention may be either negative or positive. Examples include: a chemically amplified resist including an acid generator and a binder having a group that is decomposed by an acid to change the alkali dissolution rate; a chemically amplified resist including an alkali soluble binder, an acid generator, and a low molecular compound that is decomposed by an acid to change the alkali dissolution rate of the resist; a chemically amplified resist including an acid generator, a binder having a group that is decomposed by an acid to change the alkali dissolution rate, and a low molecular compound that is decomposed by an acid to change the alkali dissolution rate of the resist; a non-chemically amplified resist including a binder having a group that is decomposed by EUV to change the alkali dissolution rate; and a non-chemically amplified resist including a binder having a moiety that is cleaved by EUV to change the alkali dissolution rate.

Examples of the EUV resist materials include methacrylate-based materials, PHS-based materials, and hybrid materials containing both methacrylate and hydroxystyrene (HS).

In the present invention, a KrF resist or an ArF resist can be used. The KrF resist or the ArF resist to be applied under the resist overlayer film in the present invention may be either a negative photoresist or a positive photoresist. Examples of the resist include a positive photoresist including a novolac resin and 1,2-naphthoquinonediazidesulfonic acid ester, a chemically amplified photoresist including a binder having a group that is decomposed by acids to increase the alkali dissolution rate and a photo acid generator, a chemically amplified photoresist including a low molecular weight compound that is decomposed by acids to increase the alkali dissolution rate of the photoresist, an alkali soluble binder, and a photo acid generator, and a chemically amplified photoresist including a binder having a group decomposed by acids to increase the alkali dissolution rate, a low molecular weight compound decomposed by acids to increase the alkali dissolution rate of the photoresist, and a photo acid generator. Examples include the trade name APEX-E manufactured by The Dow Chemical Company (ex-Rohm and Haas Electronic Materials), the trade name PAR710 manufactured by Sumitomo Chemical Industry Co., Ltd., and the trade name SEPR430 manufactured by Shin-Etsu Chemical Co., Ltd. Another example is a fluorine atom-containing polymer-based photoresist, for example, as described in ProC. SPIE, Vol. 3999, 330-334 (2000), ProC. SPIE, Vol. 3999, 357-364 (2000), and ProC. SPIE, Vol. 399), 365-374 (2000).

In the present invention, an EB (electron beam) resist can be used. The electron beam resist to be applied under the resist overlayer film in the present invention may be either a negative photoresist or a positive photoresist. Examples of the resist include a chemically amplified resist including an acid generator and a binder having a group that is decomposed by acids to change the alkali dissolution rate, a chemically amplified resist including an alkali soluble binder, an acid generator, and a low molecular weight compound that is decomposed by acids to change the alkali dissolution rate of the resist, a chemically amplified resist including an acid generator, a binder having a group decomposed by acids to change the alkali dissolution rate, and a low molecular weight compound that is decomposed by acids to change the alkali dissolution rate of the resist, a non-chemically amplified resist including a binder having a group that is decomposed by electron beams to change the alkali dissolution rate, and a non-chemically amplified resist including a binder having a moiety broken by electron beams to change the alkali dissolution rate. The resist pattern can be formed using such electron beam resists in the same manner as when a photoresist is used with KrF or ArF light as a source of radiation.

Examples of the developer for a positive resist having a resist overlayer film formed of the resist overlayer film forming composition of the present invention include aqueous solutions of alkalis including: inorganic alkalis such as sodium hydroxide, potassium hydroxide, sodium carbonate, sodium silicate, sodium metasilicate, and aqueous ammonia; primary amines such as ethylamine and N-propylamine; secondary amines such as diethylamine and di-N-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide, and choline; and cyclic amines such as pyrrole and piperidine. The aqueous solutions of alkalis may contain alcohols such as isopropyl alcohol or a surfactant such as a nonionic surfactant in an appropriate amount to be used. Among these developers, quaternary ammonium salts are preferred, and tetramethylammonium hydroxide and choline are more preferred.

(Method for Producing Semiconductor Device)

A method for producing a semiconductor device of the present invention including the resist overlayer film forming composition of the present invention will be described below.

In the present invention, a method for producing a semiconductor device can be used, for example, which includes: forming an EUV resist film on a substrate having a target film onto which a transfer pattern is to be formed, with or without an EUV resist underlayer film; applying the EUV resist overlayer film forming composition according to the present invention onto the resist film and baking the composition to form an EUV resist overlayer film; exposing the semiconductor substrate covered with the resist overlayer film and the resist film; and performing development after exposure to remove the resist overlayer film and the resist film. The exposure is performed with EUV light (at a wavelength of 13.5 nm).

Producing the resist overlayer film is generally performed by spin coating in the same manner as in formation of a resist film. For example, a substrate to be processed (for example, a silicon/silicon dioxide-coated substrate, a glass substrate, or an ITO substrate) is set on a spin coater manufactured by Tokyo Electron Limited, a resist film is formed on the substrate to be processed, and the resist overlayer film forming composition (varnish) is applied on the substrate with a spin rate of 200 rpm to 3000 rpm, for example, followed by baking on a hot plate at 50° C. to 150° C. for 30 to 300 seconds to form the resist overlayer film. The thickness of the resist overlayer film formed is 3 nm to 100 nm, 5 nm to 100 nm, or 5 nm to 50 nm.

The dissolution rate of the resist overlayer film to be formed in a photoresist developer is 1 nm or more per second, preferably 3 nm or more per second, more preferably 10 nm or more per second. If the dissolution rate is smaller than those values, the time required for removing the resist overlayer film is increased, resulting in lower productivity. After that, by pattern formation with appropriate exposure light followed by development using a resist developer to remove unnecessary parts of the resist and the resist overlayer film, a resist pattern is formed.

The semiconductor device to which the EUV resist overlayer film forming composition of the present invention is applied is configured such that a target film onto which a pattern is to be transferred, a resist film, and a resist overlayer film are successively formed on a substrate. The resist overlayer film reduces the adverse effects caused by the underlying substrate and EUV, so that a good resist pattern having a straight shape can be formed and a sufficient margin for EUV doses can be obtained. The resist overlayer film of the present invention has a high wet etching rate equivalent to or greater than the underlying resist film and can be easily removed together with unnecessary parts of the resist film after exposure with an alkaline developer or other substances.

The substrate to be processed of the semiconductor device can be processed either by a dry etching process or a wet etching process. The good resist pattern to be formed by using the resist overlayer film can be used as a mask to transfer a pattern with a good shape on the substrate to be processed by dry etching or wet etching.

In the present invention, a method for producing a semiconductor device can be used, for example, which includes: forming a KrF resist film on a substrate having a target film onto which a transfer pattern is to be formed, with or without a KrF resist underlayer film; applying a KrF resist overlayer film forming composition according to the present invention on the resist film and baking the composition to form a KrF resist overlayer film; exposing the semiconductor substrate covered with the resist overlayer film and the resist film; and performing development after exposure to remove the resist overlayer film and the resist film. The exposure is performed with KrF. The resist overlayer film is formed in the same manner as in the EUV exposure.

In the present invention, a method for producing a semiconductor device can be used, for example, which includes: forming an ArF resist film on a substrate having a target film onto which a transfer pattern is to be formed, with or without an ArF resist underlayer film; applying an ArF resist overlayer film forming composition according to the present invention on the resist film and baking the composition to form an ArF resist overlayer film; exposing the semiconductor substrate covered with the resist overlayer film and the resist film; and performing development after exposure to remove the resist overlayer film and the resist film. The exposure is performed with ArF. The resist overlayer film is formed in the same manner as in the EUV exposure.

In the present invention, a method for producing a semiconductor device can be used, for example, which includes: forming an electron beam resist film on a substrate having a target film onto which a transfer pattern is to be formed, with or without an electron beam (EB) resist underlayer film; applying an electron beam resist overlayer film forming composition according to the present invention on the resist film and baking the composition to form an electron beam resist overlayer film; exposing the semiconductor substrate covered with the resist overlayer film and the resist film; and performing development after exposure to remove the resist overlayer film and the resist film. The exposure is performed with electron beams. The resist overlayer film is formed in the same manner as in the EUV exposure.

(Method for Forming Resist Pattern)

In the present invention, for example, a method for forming a resist pattern can be used, which includes: forming an EUV resist film on a substrate having a target film for processing onto which a transfer pattern is to be formed, with or without an EUV resist underlayer film; applying the EUV resist overlayer film forming composition according to the present invention onto the resist film and baking the composition to form an EUV resist overlayer film; exposing the semiconductor substrate covered with the resist overlayer film and the resist film; and performing development after exposure to remove the resist overlayer film and the resist film. The exposure is performed with EUV.

The resist overlayer film is generally formed by spin coating in the same manner as in formation of a resist film. For example, a substrate to be processed (for example, a silicon/silicon dioxide-coated substrate, a glass substrate, or an ITO substrate) is set on a spin coater manufactured by Tokyo Electron Limited, a resist film is formed on the substrate to be processed, and the resist overlayer film forming composition (varnish) is applied on the substrate to be processed with a spin rate of 200 rpm to 3000 rpm, followed by baking on a hot plate at 50° C. to 150° C. for 30 to 300 seconds to form the resist overlayer film. The thickness of the resist overlayer film formed is 3 nm to 100 nm, 5 nm to 100 nm, or 5 nm to 50 nm.

The dissolution rate of the resist overlayer film to be formed in a photoresist developer is 1 nm or more per second, preferably 3 nm or more per second, more preferably 10 nm or more per second. If the dissolution rate is smaller than these values, the time required for removing the resist overlayer film is increased, resulting in lower productivity. After that, by pattern formation with appropriate exposure light, followed by development using a resist developer to remove unnecessary parts of the resist and the resist overlayer film, a resist pattern is formed.

In the formation method above, the exposure wavelengths may be KrF, ArF, or electron beams (EB), with the resists for KrF, ArF, or electron beams (EB) respectively.

The weight average molecular weights (Mw) of the polymers (P) shown in Synthesis Example 1 to Synthesis Example 10 and Comparative Synthesis Example 1 to Comparative Synthesis Example 6 in the present description were measured by Gel Permeation Chromatography (GPC). In the measurement, a GPC apparatus manufactured by TOSOH CORPORATION was used under the measurement conditions below. The degree of distribution shown in each synthesis example below in the present description is calculated from the measured weight average molecular weight and number average molecular weight.

Measurement device: HLC-8020GPC [trade name] (manufactured by TOSOH CORPORATION)

GPC column: TSKgel G2000HXL (two pillars), G3000HXL (one pillar), G4000HXL (one pillar) [trade name] (all manufactured by TOSOH CORPORATION), Column temperature: 40° C.

Solvent: tetrahydrofuran (THF)

Flow rate: 1.0 ml/min

Standard sample: polystyrene (manufactured by TOSOH CORPORATION)

Synthesis Example 1

A solution of 20.00 g of tert-butylstyrene (manufactured by Tokyo Chemical industry Co., Ltd.) and 7.16 g of methacrylic acid (manufactured by Tokyo Chemical Industry Co., Ltd.) dissolved in 182 g of ethyl lactate was heated and refluxed. To the solution after heating and reflux, a solution of 1.71 g of azobisisobutyronitrile (manufactured by Tokyo Chemical Industry Co., Ltd.) dissolved in 78.0 g of ethyl lactate was slowly added dropwise and, after dropwise addition, the mixture was heated and refluxed at 160° C. for reaction for 24 hours to yield a solution containing a polymer (P-1). This reaction solution was precipitated in 2,000 g of a water/methanol mixed solvent, and the resultant white solid was filtered off and then dried under reduced pressure at 40° C. overnight to yield the white polymer (P-1). This polymer (P-1) was subjected to GPC analysis, and the weight average molecular weight was 1,200 in terms of standard polystyrene. Presumably, the polymer (P-1) has the structure of Formula (p-1).

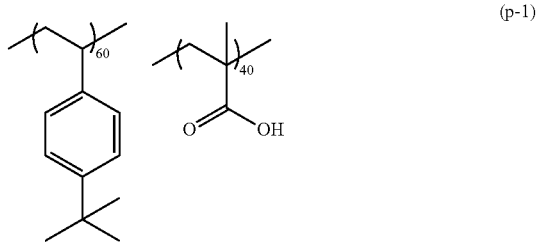

(p-1)

Synthesis Example 2

A solution of 20.00 g of tert-butylstyrene (manufactured by Tokyo Chemical Industry Co., Ltd.), 8.60 g of methacrylic acid (manufactured by Tokyo Chemical Industry Co., Ltd.), and 2.82 g of N-isopropylacrylamide (manufactured by Tokyo Chemical Industry Co., Ltd.) dissolved in 211 g of ethyl lactate was heated and refluxed. To the solution after heating and reflux, a solution of 2.05 g of azobisisobutyronitrile (manufactured by Tokyo Chemical Industry Co., Ltd.) dissolved in 90.4 g of ethyl lactate wad slowly added dropwise and, after dropwise addition, the mixture was heated and refluxed at 160° C. for reaction for 24 hours to yield a solution containing a polymer (P-2). This reaction solution was precipitated in 2,000 g of a water/methanol mixed solvent, and the resultant whitish yellow solid was filtered off and then dried under reduced pressure at 40° C. overnight to yield the whitish yellow polymer (P-2). This polymer (P-2) was subjected to GPC analysis, and the weight average molecular weight was 1,330 in terms of standard polystyrene. Presumably, the polymer (P-2) has the structure of Formula (p-2).

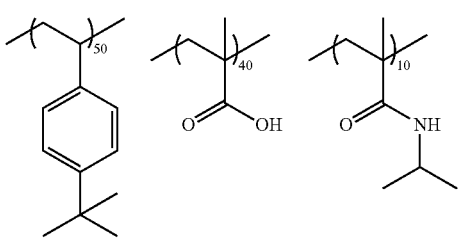

(p-2)

Synthesis Example 3

A solution of 20.00 g of tert-butylstyrene (manufactured by Tokyo Chemical Industry Co., Ltd.), 8.60 g of methacrylic acid (manufactured by Tokyo Chemical industry Co., Ltd.), and 2.82 g of N-tert-butylmethacrylamide (manufactured by Tokyo Chemical Industry Co., Ltd.) dissolved in 211 g of ethyl lactate was heated and refluxed. To the solution after heating and reflux, a solution of 2.05 g of azobisisobutyronitrile (manufactured by Tokyo Chemical Industry Co., Ltd.) dissolved in 90.4 g of ethyl lactate was slowly added dropwise and, after dropwise addition, the mixture was heated and refluxed at 160° C. for reaction for 24 hours to yield a solution containing a polymer (P-3). This reaction solution was precipitated in 2,000 g of a water/methanol mixed solvent, and the resultant whitish yellow solid was filtered off and then dried under reduced pressure at 40° C. overnight to yield the whitish yellow polymer (P-3). This polymer (P-3) was subjected to GPC analysis, and the weight average molecular weight was 1,460 in terms of standard polystyrene. Presumably, the polymer (P-3) has the structure of Formula (p-3).

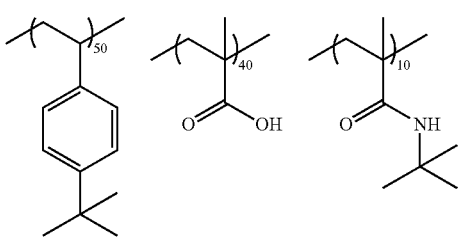

(p-3)

Synthesis Example 4

A solution of 20.00 g of tert-butylstyrene (manufactured by Tokyo Chemical Industry Co., Ltd.), 8.60 g of methacrylic acid (manufactured by Tokyo Chemical Industry Co., Ltd.), and 3.18 g of N-tert-butylacrylamide (manufactured by Tokyo Chemical Industry Co., Ltd.) dissolved in 213 g of ethyl lactate was heated and refluxed. To the solution after heating and reflux, a solution of 2.05 g of azobisisobutyronitrile (manufactured by Tokyo Chemical Industry Co., Ltd.) dissolved in 91.3 g of ethyl lactate was slowly added dropwise and, after dropwise addition, the mixture was heated and refluxed at 160° C. for reaction for 24 hours to yield a solution containing a polymer (P-4). This reaction solution was precipitated in 2,000 g of a water/methanol mixed solvent, and the resultant whitish yellow solid was filtered off and then dried under reduced pressure at 40° C. overnight to yield the whitish yellow polymer (P-4). This polymer (P-4) was subjected to GPC analysis, and the weight average molecular weight was 1,750 in terms of standard polystyrene. Presumably, the polymer (P-4) has the structure of Formula (p-4).

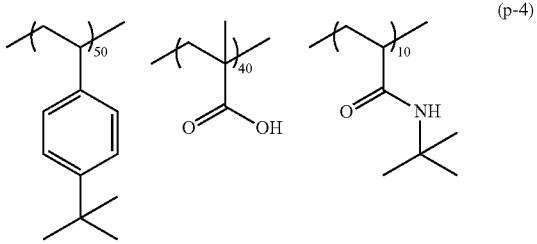

(p-4)

Synthesis Example 5

A solution of 20.00 g of tert-butylstyrene (manufactured by Tokyo Chemical Industry Co., Ltd.), 8.60 g of methacrylic acid (manufactured by Tokyo Chemical Industry Co., Ltd.), and 2.47 g of N,N-dimethylacrylamide (manufactured by Tokyo Chemical Industry Co., Ltd.) dissolved in 208 g of ethyl lactate was heated and refluxed. To the solution after heating and reflux, a solution of 2.05 g of azobisisobutyronitrile (manufactured by Tokyo Chemical Industry Co., Ltd.) dissolved in 89.4 g of ethyl lactate was slowly added dropwise and, after dropwise addition, the mixture was heated and refluxed at 160° C. for reaction for 24 hours to yield a solution containing a polymer (P-5). This reaction solution was precipitated in 2,000 g of a water/methanol mixed solvent, and the resultant whitish yellow solid was filtered off and then dried under reduced pressure at 40° C. overnight to yield the whitish yellow polymer (P). This polymer (P-5) was subjected to GPC analysis, and the weight average molecular weight was 1,550 in terms of standard polystyrene. Presumably, the polymer (P-5) has the structure of Formula (p-5).

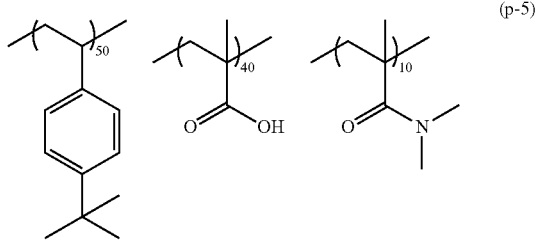

(p-5)

Synthesis Example 6

A solution of 20.00 g of tert-butylstyrene (manufactured by Tokyo Chemical Industry Co., Ltd.), 8.60 g of methacrylic acid (manufactured by Tokyo Chemical Industry Co., Ltd.), and 3.18 g of N,N-diethylacrylamide (manufactured by Tokyo Chemical Industry Co., Ltd.) dissolved in 213 g of ethyl lactate was heated and refluxed. To the solution after heating and reflux, a solution of 2.05 g of azobisisobutyronitrile (manufactured by Tokyo Chemical Industry Co., Ltd.) dissolved in 91.3 g of ethyl lactate was slowly added dropwise and, after dropwise addition, the mixture was heated and refluxed at 160° C. for reaction for 24 hours to yield a solution containing a polymer (P-6). This reaction solution was precipitated in 2,000 g of a water/methanol mixed solvent, and the resultant whitish yellow solid was filtered off and then dried under reduced pressure at 40° C. overnight to yield the whitish yellow polymer (P-6). This polymer (P-6) was subjected to GPC analysis, and the weight average molecular weight was 1,500 in terms of standard polystyrene. Presumably, the polymer (P-6) has the structure of Formula (p-6).

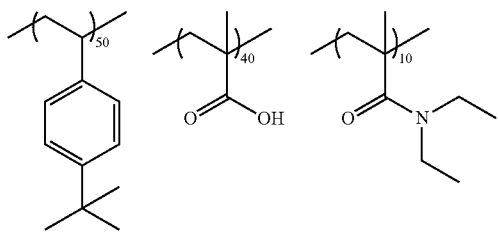

(p-6)

Synthesis Example 7

A solution of 20.00 g of tert-butylstyrene (manufactured by Tokyo Chemical Industry Co., Ltd.), 8.60 g of methacrylic acid (manufactured by Tokyo Chemical Industry Co., Ltd.), and 1.77 g of acrylamide (manufactured by Tokyo Chemical Industry Co., Ltd.) dissolved in 204 g of ethyl lactate was heated and refluxed at 160° C. for 24 hours. To the solution after heating and reflux, a solution of 2.05 g of azobisisobutyronitrile (manufactured by Tokyo Chemical Industry Co., Ltd.) dissolved in 87.5 g of ethyl lactate was slowly added dropwise and, after dropwise addition, the mixture was heated and refluxed for reaction for 24 hours to yield a solution containing a polymer (P-7). This reaction solution was precipitated in 2000 g of a water/methanol mixed solvent, and the resultant whitish yellow solid was filtered off and then dried under reduced pressure at 40° C. overnight to yield the whitish yellow polymer (P-7). This polymer (P-7) was subjected to GPC analysis, and the weight average molecular weight was 1,470 in terms of standard polystyrene. Presumably, the polymer (P-7) has the structure of Formula (p-7).

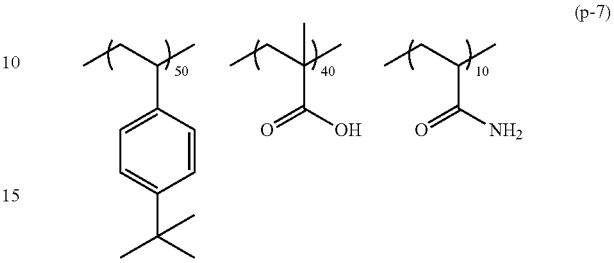

(p-7)

Synthesis Example 8

A solution of 20.00 g of tert-butylstyrene (manufactured by Tokyo Chemical Industry Co., Ltd.), 8.60 g of methacrylic acid (manufactured by Tokyo Chemical Industry Co., Ltd.), and 4.20 g of 2,2,2-trifluoroethyl methacrylate (manufactured by Tokyo Chemical Industry Co., Ltd.) dissolved in 219 g of ethyl lactate was heated and refluxed. To the solution after heating and reflux, a solution of 2.05 g of azobisisobutyronitrile (manufactured by Tokyo Chemical Industry Co., Ltd.) dissolved in 94.0 g of ethyl lactate was slowly added dropwise and, after dropwise addition, the mixture was heated and refluxed at 160° C. for reaction for 24 hours to yield a solution containing a polymer (P-8). This reaction solution was precipitated in 2,000 g of a water/methanol mixed solvent, and the resultant white solid was filtered off and then dried under reduced pressure at 40° C. overnight to yield the white polymer (P-8). This polymer (P-8) was subjected to GPC analysis, and the weight average molecular weight was 1,520 in terms of standard polystyrene. Presumably, the polymer (P-8) has the structure of Formula (p-8).

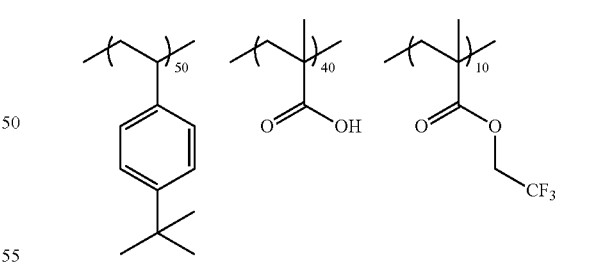

(p-8)

Synthesis Example 9

A solution of 20.00 g of tert-butylstyrene (manufactured by Tokyo Chemical Industry Co., Ltd.), 8.60 g of methacrylic acid (manufactured by Tokyo Chemical Industry Co., Ltd.), and 5.89 g of 1,1,1,3,3,3-hexafluoroisopropyl methacrylate (manufactured by Tokyo Chemical Industry Co., Ltd.) dissolved in 230 g of ethyl lactate was heated and refluxed. To the solution after heating and reflux, a solution of 2.05 g of azobisisobutyronitrile (manufactured by Tokyo Chemical Industry Co., Ltd.) dissolved in 98.7 g of ethyl lactate was slowly added dropwise and, after dropwise addition, the mixture was heated and refluxed at 160° C. for reaction for 24 hours to yield a solution containing a polymer (P-9). This reaction solution was precipitated in 2,000 g of a water/methanol mixed solvent, and the resultant white solid was filtered off and then dried under reduced pressure at 40° C. overnight to yield the white polymer (P-9). This polymer (P-9) was subjected to GPC analysis, and the weight average molecular weight was 1,950 in terms of standard polystyrene. Presumably, the polymer (P-9) has the structure of Formula (p-9).

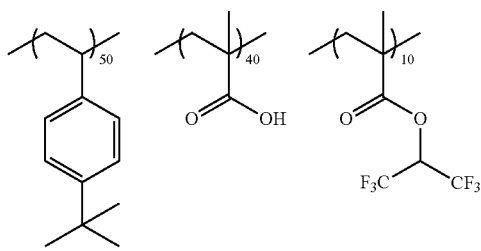

(p-9)

Synthesis Example 10

A solution of 20.00 g of tert-butylstyrene (manufactured by Tokyo Chemical Industry Co., Ltd.), 10.74 g of methacrylic acid (manufactured by Tokyo Chemical Industry Co., Ltd.), 3.53 g of N-isopropylacrylamide (manufactured by Tokyo Chemical Industry Co., Ltd.), and 7.37 g of 1,1,1,3,3,3-hexafluoroisopropyl methacrylate (manufactured by Tokyo Chemical Industry Co., Ltd.) dissolved in 277 g of ethyl lactate was heated and refluxed. To the solution after heating and reflux, a solution of 2.31 g of azobisisobutyronitrile (manufactured by Tokyo Chemical Industry Co., Ltd.) dissolved in 118 g of ethyl lactate was slowly added dropwise and, after dropwise addition, the mixture was heated and refluxed at 160° C. for reaction for 24 hours to yield a solution containing a polymer (P-10). This reaction solution was precipitated in 2,000 g of a water/methanol mixed solvent, and the resultant whitish yellow solid was filtered off and then dried under reduced pressure at 40° C. overnight to yield the whitish yellow polymer (P-10). This polymer (P-10) was subjected to GPC analysis, and the weight average molecular weight was 1,680 in terms of standard polystyrene. Presumably, the polymer (P-10) has the structure of Formula (p-10).

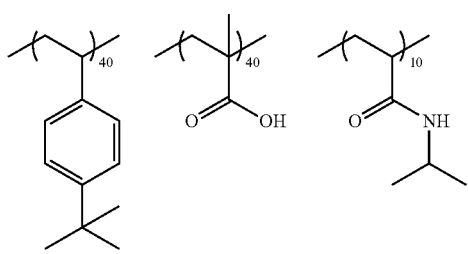

(p-10)

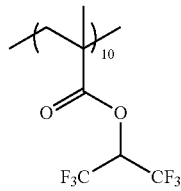

Comparative Synthesis Example 1

A solution of 20.00 g of tert-butylstyrene (manufactured by Tokyo Chemical Industry Co., Ltd.), 8.60 g of methacrylic acid (manufactured by Tokyo Chemical Industry Co., Ltd.), and 2.82 g of N-isopropylacrylamide (manufactured by Tokyo Chemical Industry Co., Ltd.) dissolved in 55 g of ethyl lactate was heated and refluxed. To the solution after heating and reflux, a solution of 2.05 g of azobisisobutyronitrile (manufactured by Tokyo Chemical Industry Co., Ltd.) dissolved in 23.4 g of ethyl lactate was slowly added dropwise and, after dropwise addition, the mixture was heated and refluxed at 160° C. for reaction for 24 hours to yield a solution containing a polymer (P-11). This reaction solution was precipitated in 2,000 g of a water/methanol mixed solvent, and the resultant whitish yellow solid was filtered off and then dried under reduced pressure at 40° C. overnight to yield the whitish yellow polymer (P-11). This polymer (P-11) was subjected to GPC analysis, and the weight average molecular weight was 3,050 in terms of standard polystyrene. Presumably, the polymer (P-11) has the structure of Formula (p-11).

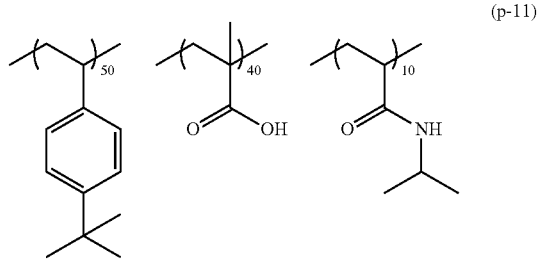

(p-11)

Comparative Synthesis Example 2

A solution of 20.00 g of tert-butylstyrene (manufactured by Tokyo Chemical Industry Co., Ltd.) and 11.83 g of tert-butyl methacrylate (manufactured by Tokyo Chemical Industry Co., Ltd.) dissolved in 211 g of ethyl lactate was heated and refluxed. To the solution after heating and reflux, a solution of 1.71 g of azobisisobutyronitrile (manufactured by Tokyo Chemical Industry Co., Ltd.) dissolved in 90.5 g of ethyl lactate was slowly added dropwise and, after dropwise addition, the mixture was heated and refluxed at 160° C. for reaction for 24 hours to yield a solution containing a polymer (P-12). This reaction solution was precipitated in 2,000 g of a water/methanol mixed solvent, and the resultant white solid was filtered off and then dried under reduced pressure at 40° C. overnight to yield the white polymer (P-12). This polymer (P-12) was subjected to GPC analysis, and the weight average molecular weight was 1,200 in terms of standard polystyrene. Presumably, the polymer (P-12) has the structure of Formula (p-12).

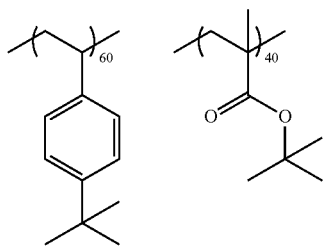

(p-12)

Comparative Synthesis Example 3

A solution of 20.00 g of 4-vinylbenzoic acid (manufactured by TOSOH ORGANIC CHEMICAL CO., LTD.) and 7.75 g of methacrylic acid (manufactured by Tokyo Chemical Industry Co., Ltd.) dissolved in 394 g of ethyl lactate was heated and refluxed. To the solution after heating and reflux, a solution of 1.87 g of azobisisobutyronitrile (manufactured by Tokyo Chemical Industry Co., Ltd.) dissolved in 168.7 g of propylene glycol monomethyl ether was slowly added dropwise and, after dropwise addition, the mixture was heated and refluxed at 140° C. for reaction for 24 hours to yield a solution containing a polymer (P-13). This reaction solution was precipitated in 2,000 g of a water/methanol mixed solvent, and the resultant white solid was filtered off and then dried under reduced pressure at 40° C. overnight to yield the white polymer (P-13). This polymer (P-13) was subjected to GPC analysis, and the weight average molecular weight was 1,960 in terms of standard polystyrene. Presumably, the polymer (P-13) has the structure of Formula (p-13).

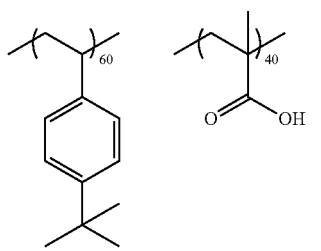

(p-13)

Comparative Synthesis Example 4

A solution of 20.00 g of tert-butyl methacrylate (manufactured by Tokyo Chemical Industry Co., Ltd.) and 8.07 g of methacrylic acid (manufactured by Tokyo Chemical Industry Co., Ltd.) dissolved in 82 g of ethyl lactate was heated and refluxed. To the solution after heating and reflux, a solution of 1.15 g of azobisisobutyronitrile (manufactured by Tokyo Chemical Industry Co., Ltd.) dissolved in 35.1 g of ethyl lactate was slowly added dropwise and, after dropwise addition, the mixture was heated and refluxed at 160° C. for reaction for 24 hours to yield a solution containing a polymer (P-14). This reaction solution was precipitated in 2,000 g of a water/methanol mixed solvent, and the resultant white solid was filtered off and then dried under reduced pressure at 40° C. overnight to yield the white polymer (P-14). This polymer (P-14) was subjected to GPC analysis, and the weight average molecular weight was 1,910 in terms of standard polystyrene. Presumably, the polymer (P-14) has the structure of Formula (p-14).

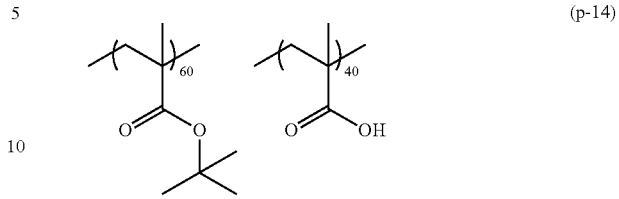

(p-14)

Comparative Synthesis Example 5

To 33.2 g of propylene glycol monomethyl ether, 3.5 g of 1,5-dihydroxynaphthalene (manufactured by Tokyo Chemical Industry Co., Ltd.), 1.2 g of 3,4-dihydroxybenzaldehyde (manufactured by Tokyo Chemical Industry Co., Ltd.), 3.6 g of 3,5-bis(trifluoromethyl)benzaldehyde (manufactured by Tokyo Chemical Industry Co., Ltd.), and 0.43 g of p-toluenesulfonic acid monohydrate (manufactured by Tokyo Chemical Industry Co., Ltd.) were added and dissolved. After the reaction chamber was purged with nitrogen, a reaction was allowed to occur at 140° C. for 4 hours to yield a solution containing a polymer (P-15). The resultant solution was added to a solution of methanol:water=1:9 to yield the brown polymer (P-15). GPC analysis was performed, and the resultant polymer had a weight average molecular weight of 2,830. Presumably, the polymer (P-5) has the structure of Formula (p-15).

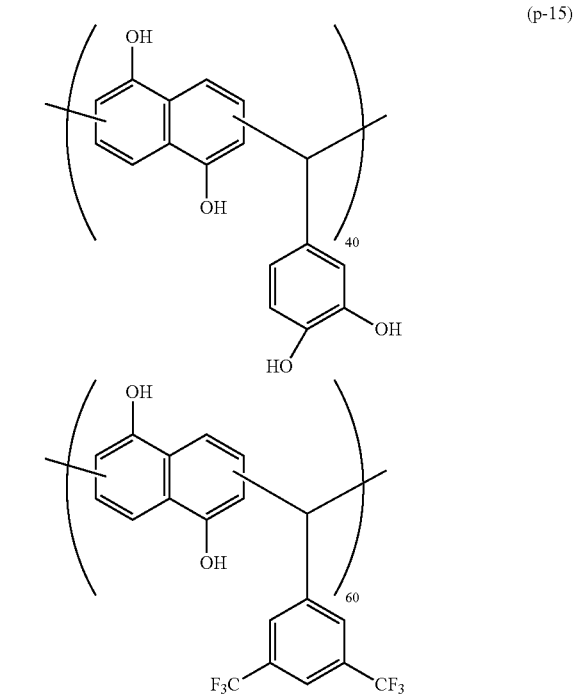

(p-15)

Comparative Synthesis Example 6

A solution of 20.0 g of 2,3,4,5,6-pentafluorostyrene (manufactured by Tokyo Chemical Industry Co., Ltd.) and 1.70 g of 4-vinylbenzoic acid (manufactured by TOSOH ORGANIC CHEMICAL CO., LTD.) dissolved in 148 g of ethyl lactate was heated and refluxed. To the solution after heating and reflux, a solution of 1.03 g of azobisisobutyronitrile (manufactured by Tokyo Chemical Industry Co., Ltd.) dissolved in 63.6 g of ethyl lactate was slowly added dropwise and, after dropwise addition, the mixture was heated and refluxed at 160° C. for reaction for 24 hours to yield a solution containing a polymer (P-16). This reaction solution was precipitated in 2,000 g of a water/methanol mixed solvent, and the resultant white solid was filtered off and then dried under reduced pressure at 40° C. overnight to yield the white polymer (P-16). This polymer (P-16) was subjected to GPC analysis, and the weight average molecular weight was 1,400 in terms of standard polystyrene. Presumably, the polymer (P-16) has the structure of Formula (p-16).

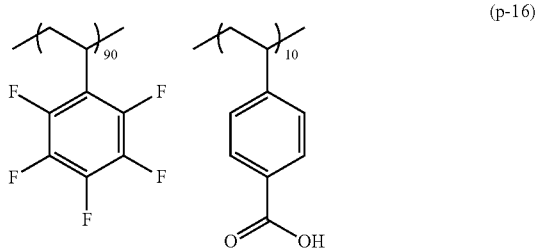

(p-16)

Example 1

In 0.6 g of the polymer (P-1) obtained in Synthesis Example 1, 19.4 g of diisoamyl ether was added and dissolved. Then, the solution was filtered using a polyethylene microfilter having a pore diameter of 0.05 μm to prepare a resist overlayer film forming composition to be used for lithography.

Example 2

In 0.6 g of the polymer (P-2) obtained in Synthesis Example 2, 19.4 g of diisoamyl ether was added and dissolved. Then, the solution was filtered using a polyethylene microfilter having a pore diameter of 0.05 μm to prepare a resist overlayer film forming composition to be used for lithography.

Example 3

In 0.6 g of the polymer (P-3) obtained in Synthesis Example 3, 19.4 g of diisoamyl ether was added and dissolved. Then, the solution was filtered using a polyethylene microfilter having a pore diameter of 0.05 μm to prepare a resist overlayer film forming composition to be used for lithography.

Example 4

In 0.6 g of the polymer (P-4) obtained in Synthesis Example 4, 19.4 g of diisoamyl ether was added and dissolved. Then, the solution was filtered using a polyethylene microfilter having a pore diameter of 0.05 μm to prepare a resist overlayer film forming composition to be used for lithography.

Example 5

In 0.6 g of the polymer (P-5) obtained in Synthesis Example 5, 19.4 g of diisoamyl ether was added and dissolved. Then, the solution was filtered using a polyethylene microfilter having a pore diameter of 0.05 μm to prepare a resist overlayer film forming composition to be used for lithography.

Example 6

In 0.6 g of the polymer (P-6) obtained in Synthesis Example 6, 19.4 g of diisoamyl ether was added and dissolved. Then, the solution was filtered using a polyethylene microfilter having a pore diameter of 0.05 μm to prepare a resist overlayer film forming composition to be used for lithography.

Example 7

In 0.6 g of the polymer (P-7) obtained in Synthesis Example 7, 19.4 g of diisoamyl ether was added and dissolved. Then, the solution was filtered using a polyethylene microfilter having a pore diameter of 0.05 μm to prepare a resist overlayer film forming composition to be used for lithography.

Example 8

In 0.6 g of the polymer (P-8) obtained in Synthesis Example 8, 19.4 g of diisoamyl ether was added and dissolved. Then, the solution was filtered using a polyethylene microfilter having a pore diameter of 0.05 μm to prepare a resist overlayer film forming composition to be used for lithography.

Example 9

In 0.6 g of the polymer (P-9) obtained in Synthesis Example 9, 19.4 g of diisoamyl ether was added and dissolved. Then, the solution was filtered using a polyethylene microfilter having a pore diameter of 0.05 μm to prepare a resist overlayer film forming composition to be used for lithography.

Example 10

In 0.6 g of the polymer (P-10) obtained in Synthesis Example 10, 19.4 g of diisoamyl ether was added and dissolved. Then, the solution was filtered using a polyethylene microfilter having a pore diameter of 0.05 μm to prepare a resist overlayer film forming composition to be used for lithography.

Example 11

In 0.6 g of the polymer (P-1) solution obtained in Synthesis Example 1, 17.46 g of diisoamyl ether and 1.94 g of 4-methyl-2-pentanol were added and dissolved. Then, the solution was filtered using a polyethylene microfilter having a pore diameter of 0.05 μm to prepare a resist overlayer film forming composition to be used for lithography.

Example 12

In 0.6 g of the polymer (P-1) obtained in Synthesis Example 1, 16.49 g of diisoamyl ether and 2.91 g of 4-methyl-2-pentanol were added and dissolved. Then, the solution was filtered using a polyethylene microfilter having a pore diameter of 0.05 μm to prepare a resist overlayer film forming composition to be used for lithography.

Comparative Example 1

In 0.6 g of the polymer (P-11) obtained in Comparative Synthesis Example 1, 17.46 g of diisoamyl ether and 1.94 g of 4-methyl-2-pentanol were added and dissolved. Then, the solution was filtered using a polyethylene microfilter having a pore diameter of 0.05 μm to prepare a resist overlayer film forming composition to be used for lithography.

Comparative Example 2

In 0.6 g of the polymer (P-12) obtained in Comparative Synthesis Example 2, 19.4 g of diisoamyl ether was added and dissolved. Then, the solution was filtered using a polyethylene microfilter having a pore diameter of 0.05 μm to prepare a resist overlayer film forming composition to be used for lithography.

Comparative Example 3

In 0.6 g of the polymer (P-13) obtained in Comparative Synthesis Example 3, 17.46 g of diisoamyl ether and 1.94 g of 4-methyl-2-pentanol were added and dissolved. Then, the solution was filtered using a polyethylene microfilter having a pore diameter of 0.05 μm to prepare a resist overlayer film forming composition to be used for lithography.

Comparative Example 4

In 0.6 g of the polymer (P-14) obtained in Comparative Synthesis Example 4, 19.4 g of diisoamyl ether was added and dissolved. Then, the solution was filtered using a polyethylene microfilter having a pore diameter of 0.05 μm to prepare a resist overlayer film forming composition to be used for lithography.

Comparative Example 5

In 0.6 g of the polymer (P-15) obtained in Comparative Synthesis Example 5, 19.4 g of diisoamyl ether was added and dissolved. Then, the solution was filtered using a polyethylene microfilter having a pore diameter of 0.05 μm to prepare a resist overlayer film forming composition to be used for lithography.

Comparative Example 6

In 0.6 g of the polymer (P-16) obtained in Comparative Synthesis Example 6, 19.4 g of 4-methyl-2-pentanol was added and dissolved. Then, the solution was filtered using a polyethylene microfilter having a pore diameter of 0.05 μm to prepare a resist overlayer film forming composition to be used for lithography.

Comparative Example 7

In 0.6 g of the polymer (P-11) obtained in Comparative Synthesis Example 1, 19.4 g of diisoamyl ether was added for dissolution. However, the precipitation of the polymer was found and a resist overlayer film forming composition for lithography was not obtained.

Comparative Example 8

In 0.6 g of the polymer (P-16) obtained in Comparative Synthesis Example 6, 19.4 g of diisoamyl ether was added for dissolution. However, the precipitation of the polymer was found and a resist overlayer film forming composition for lithography was not obtained.

[Test for Confirming Insolubility of Resist in Ether-Based Solvent]

An EUV resist solution (hydroxystyrene (HS)-containing resist) was applied using a spinner. The solution was heated on a hot plate at 100° C. for one minute to form a resist film, and the film thickness was measured.

After the solvents for the resist overlayer film forming compositions (dibutyl ether, diisoamyl ether, diisobutyl ether) and the resist overlayer film forming compositions of Example 1, Example 11, and Example 12 were each applied on the resist film using a spinner and heated on a hot plate at 100° C. for one minute, a puddle of a commercially available alkaline developer (manufactured by TOKYO OHKA KOGYO CO., LTD., product name: NMD-3) was formed on the resist (in the case of the solvents for the resist overlayer film forming compositions) or on the resist overlayer film (in the case of Example 1, Example 11, and Example 12) and left for 60 seconds, followed by rinsing with pure water for 30 seconds while being rotated at 3000 rpm. After rinsing, baking was performed at 100° C. for 60 seconds, and the film thickness was measured.

The degree of film loss of the resist was determined as shown in Table 1. The state in which almost no film loss is found is shown by ⊙, and the state in which the film loss is found, which poses no problem in practice, is shown by ○.

TABLE 1

| Resist Insolubility Confirming Test | |
|---|---|
| Dibutyl ether | ⊙ |
| Diisoamyl ether | ⊙ |
| Diisobutyl ether | ⊙ |
| Example 1 | ⊙ |
| Example 11 | ⊙ |
| Example 12 | ○ |

[Application Test for PTD Process]

The resist overlayer film forming composition solutions prepared in Example 1 to Example 9 of the present invention and Comparative Example 1 and Comparative Example 2 were each applied on the wafer using a spinner and heated on a hot plate at 100° C. for one minute to form a resist overlayer film, and the film thickness was measured (film thickness A: the film thicknesses of the resist overlayer film).

A puddle of a commercially available alkaline developer (manufactured by TOKYO OHKA KOGYO CO., LTD., product name: NMD-3) was formed on the resist overlayer film and left for 60 seconds, followed by rinsing with pure water for 30 seconds while being rotated at 3000 rpm. After rinsing, baking was performed at 100° C. for 60 seconds, and the film thickness was measured (film thickness B). If film thickness B is 0 nm, it can be said that the resist overlayer film was able to be removed by the developer.

This shows that the composition of the present invention is applicable as a resist overlayer film for a PTD process (Table 2).

TABLE 2

Film Thickness Measurement

| | Film thickness A (nm) | Film thickness B (nm) |
|---|---|---|
| Example 1 | 30 | 0 |
| Example 2 | 30 | 0 |
| Example 3 | 30 | 0 |
| Example 4 | 30 | 0 |
| Example 5 | 30 | 0 |
| Example 6 | 30 | 0 |
| Example 7 | 30 | 0 |
| Example 8 | 30 | 0 |
| Example 9 | 30 | 0 |
| Comparative Example 1 | 30 | 30 |
| Comparative Example 2 | 30 | 30 |

[Application Test to NTD Process]

The resist overlayer film forming composition solutions prepared in Example 1 to Example 10 of the present invention and Comparative Example 3 were each applied on a wafer using a spinner and heated on a hot plate at 100° C. for one minute to form a resist overlayer film, and the film thickness was measured (film thickness A: the film thickness of the resist overlayer film).

A puddle of butyl acetate (solvent developer), which is often used in an NTD process, was formed on the resist overlayer film, left for 60 seconds, and rotated at 3000 rpm. After that, baking was performed at 100° C. for 60 seconds, and the film thickness was measured (film thickness C). If film thickness C is 0 nm, it can be said that the resist overlayer film was able to be removed by the solvent developer. This suggests that the composition of the present invention is also applicable as a resist overlayer film for an NTD process (Table 3).

TABLE 3

Film Thickness Measurement

| | Film thickness A (nm) | Film thickness C (nm) |
|---|---|---|
| Example 1 | 30 | 0 |
| Example 2 | 30 | 0 |
| Example 3 | 30 | 0 |
| Example 4 | 30 | 0 |
| Example 5 | 30 | 0 |
| Example 6 | 30 | 0 |
| Example 7 | 30 | 0 |
| Example 8 | 30 | 0 |
| Example 9 | 30 | 0 |
| Example 10 | 30 | 0 |
| Comparative Example 3 | 30 | 30 |

[Optical Parameter Test]

The resist overlayer film forming composition solutions prepared in Example 1 to Example 10 of the present invention and Comparative Example 4 to Comparative Example 6 were each applied on a quartz substrate using a spinner. Each of the solutions was heated on a hot plate at 70° C. for one minute to form a resist overlayer film (film thickness of 30 nm). For these ten resist overlayer films, the absorptance at wavelengths of 200 nm to 260 nm was measured using a spectrophotometer. The transmissivity at 13.5 nm was calculated by simulation based on the relation between the element composition ratio and the film density.

The property of blocking DUV light is considered to be good if the largest value of absorptance is 65% or higher and to be poor if lower than 65%, in a wavelength band of 200 nm to 260 nm. The transmittance of EUV light (13.5 nm) is considered to be good if the transmissivity is 80% or higher and to be poor if lower than 80%. The resist overlayer film obtained from the resist overlayer film forming composition in each Example is superior in blocking DUV light to the resist overlayer film obtained from the resist overlayer film forming composition of Comparative Example 4 and Comparative Example 5 and in transmittance of EUV light to the resist overlayer film obtained from the resist overlayer film forming composition of Comparative Example 6 (Table 4).

TABLE 4

Transmittance of EUV light and Blocking DUV light

| | Thickness (nm) | Transmittance of EUV light | Blocking DUV light |
|---|---|---|---|
| Example 1 | 30 | good | good |
| Example 2 | 30 | good | good |
| Example 3 | 30 | good | good |
| Example 4 | 30 | good | good |
| Example 5 | 30 | good | good |
| Example 6 | 30 | good | good |
| Example 7 | 30 | good | good |
| Example 8 | 30 | good | good |
| Example 9 | 30 | good | good |
| Example 10 | 30 | good | good |
| Comparative Example 4 | 30 | good | poor |
| Comparative Example 5 | 30 | good | poor |
| Comparative Example 6 | 30 | poor | good |

[Resist Outgas Suppression Test]

An EUV resist solution was applied on a silicon wafer using a spinner and heated on a hot plate for one minute to form a resist film having a film thickness of 60 nm. After that, the resist overlayer film forming composition solution prepared in Example 2 of the present invention was applied on the resist film using a spinner and heated on a hot plate at 70° C. for one minute to form a resist overlayer film having a film thickness of 10 nm. This silicon wafer was subjected to outgas analysis using a resist outgas monitor (EUV-PER1314 manufactured by EUV Technology) (Test Example 1). The silicon wafer on which a resist overlayer film was not formed was prepared as Test Example 2. An EUV resist solution that generates more outgas than that of usual patterning was used. When the resist overlayer film obtained from the resist overlayer film forming composition of Example was applied on a resist film overlayer, the amount of outgas was significantly reduced compared with the comparative example in which no resist overlayer film was applied. This indicates that the composition according to the present invention can effectively suppress generation of outgas from the resist (Table 5).

TABLE 5

Amount of outgas (Carbon contamination film thickness)

| | Resist overlayer film forming composition | Carbon contamination film thickness |
|---|---|---|
| Text Example 1 | Example 2 | 2.59 |
| Text Example 2 | None | 6.74 |

[Formation and Evaluation of Resist Pattern]

An EUV resist solution was applied on a silicon wafer using a spinner and heated on a hot plate for one minute to form a resist film having a film thickness of 50 nm. The resist overlayer film forming compositions prepared in Examples 1 and 2 of the present invention and Comparative Example 5 were each spin-coated on the resist film, heated at 70° C. for one minute, and exposed using an EUV exposure system (EUV Micro Exposure Tool (MS-13) manufactured by Exitech Co., Ltd., under conditions of NA=0.35, σ=0.36/0.68 [Quadrupole]. After exposure, PEB was performed, and the silicon wafer was cooled to room temperature on a cooling plate, followed by development and rinsing to form a resist pattern. The target line width of the resist pattern to be formed was set to a line and space of 26 nm, and the Line Width Roughness (LWR) was compared by observing the resist pattern with optimum exposure amount and focus position (Test Examples 3 to 6). The silicon wafer on which no resist overlayer film was formed was prepared as Test Example 6. When the resist overlayer film obtained from the resist overlayer film forming composition of Example was applied as a resist film overlayer, the LWR was significantly improved compared with the comparative example in which no resist overlayer film was applied. This indicates that the composition according to the present invention is used suitably for forming a resist pattern (Table 6).

TABLE 6

LWR (Line Width Roughness)

| | Resist overlayer film forming composition | LWR (nm) |
|---|---|---|
| Text Example 3 | Example 1 | 5.1 |
| Text Example 4 | Example 2 | 4.6 |
| Text Example 5 | Comparative Example 5 | 5.4 |
| Text Example 6 | None | 5.7 |

INDUSTRIAL APPLICABILITY

The composition of the present invention is a composition for forming an EUV resist overlayer film for use in an EUV lithography process or a resist overlayer film for a lithography process in other exposure wavelengths, which does not intermix with a resist, blocks undesirable exposure light, for example, UV and DUV and selectively transmits EUV alone, for example, in EUV exposure, and can be developed with a developer after exposure.

The invention claimed is:

1. A resist overlayer film forming composition comprising:
a polymer (P) including unit structures of Formula (1) and Formula (2) and having a weight average molecular weight, measured by gel permeation chromatography, of 500 to 2,000; and
a $C_{8-16}$ ether compound as a solvent:

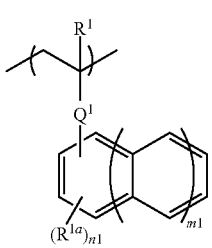
(1)

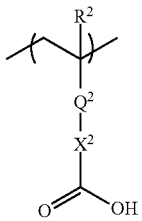
(2)

[in Formula (1) or Formula (2),
$R^1$ and $R^2$ are the same or different and are each a hydrogen atom or a $C_{1-10}$ alkyl group;
$Q^1$ and $Q^2$ are the same or different and are each a single bond, an ester bond (—C(═O)—O— or —O—C(═O)—), or an amide bond (—NH—CO— or —CO—NH—);
$X^2$ is a single bond, a $C_{1-6}$ alkylene group, or a $C_{6-14}$ arylene group;
$R^{1a}$ is a $C_{1-10}$ alkyl group;
n1 is an integer of 1 to 3; and m1 is an integer of 0 to 2].

2. The composition according to claim 1, wherein the polymer (P) further includes a unit structure of Formula (3):

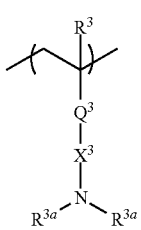
(3)

[in Formula (3),
$R^3$ is a hydrogen atom or a $C_{1-10}$ alkyl group;
$Q^3$ is a single bond, an ester bond (—C(═O)—O— or —O—C(═O)—), or an amide bond (—NH—CO— or —CO—NH—);
$X^3$ is a single bond, a $C_{1-6}$ alkylene group, or a $C_{6-14}$ arylene group; and
$R^{3a}$s are the same or different and are each a hydrogen atom, a $C_{1-10}$ alkyl group, or a $C_{1-4}$ acyl group].

3. The composition according to claim 1, wherein the polymer (P) further includes a unit structure of Formula (4):

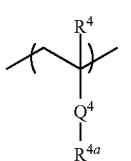
(4)

[in Formula (4),
$R^4$ is a hydrogen atom or a $C_{1-10}$ alkyl group;
$Q^4$ is a single bond, an ester bond (—C(═O)—O— or —O—C(═O)—), or an amide bond (—NH—CO— or —CO—NH—); and
$R^{4a}$ is (i) a $C_{1-10}$ alkyl group in which some or all of hydrogen atoms are optionally substituted with fluorine atoms, or (ii) a $C_{6-14}$ aryl group in which some or all of hydrogen atoms of the $C_{6-14}$ aryl group are optionally substituted with a $C_{1-10}$ alkyl group in which some or all of hydrogen atoms of the $C_{1-10}$ alkyl group are optionally substituted with fluorine atoms].

4. The composition according to claim 2, wherein the polymer (P) further includes a unit structure of Formula (4):

(4)

[in Formula (4),
$R^4$ is a hydrogen atom or a $C_{1-10}$ alkyl group;
$Q^4$ is a single bond, an ester bond (—C(=O)—O— or —O—C(=O)—), or an amide bond (—NH—CO— or —CO—NH—); and
$R^{4a}$ is (i) a $C_{1-10}$ alkyl group in which some or all of hydrogen atoms are optionally substituted with fluorine atoms, or (ii) a $C_{6-14}$ aryl group in which some or all of hydrogen atoms of the $C_{6-14}$ aryl group are optionally substituted with a $C_{1-10}$ alkyl group in which some or all of hydrogen atoms of the $C_{1-10}$ alkyl group are optionally substituted with fluorine atoms].

5. The composition according to claim 3, wherein the $R^{4a}$ is a monovalent group of Formula (5):

(5)

[in Formula (5),
$W^1$ and $W^2$ are the same or different and are each a hydrogen atom, a fluorine atom, a trifluoromethyl group, a difluoromethyl group, or a monofluoromethyl group; three $w^3$s are each independently a hydrogen atom, a fluorine atom, or a combination of the hydrogen atom and the fluorine atom; at least one of $W^1$, $W^2$, and $w^3$ is a trifluoromethyl group, a difluoromethyl group, a monofluoromethyl group, or a fluorine atom; m2 is an integer of 0 to 9; and the maximum number of carbon atoms included in Formula (5) is 10].

6. The composition according to claim 1, wherein the ether compound is dibutyl ether, diisoamyl ether, diisobutyl ether, or a combination of dibutyl ether, diisoamyl ether, and diisobutyl ether.

7. The composition according to claim 1, wherein the ether compound has a proportion, in the solvent, of not less than 87% by mass and not more than 100% by mass.

8. The composition according to claim 1, further comprising a separate acid compound or a separate acid generator compound, to adjust an acidity of the composition.

9. The composition according to claim 8, wherein the acid compound is a sulfonic acid compound or a sulfonic acid ester compound.

10. The composition according to claim 8, wherein the acid compound is an onium salt acid generator, a halogen-containing compound acid generator, or a sulfonic acid acid generator.

11. The composition according to claim 1, further comprising a basic compound.

12. A method for producing a semiconductor device, the method comprising: forming a resist film on a substrate;
applying the resist overlayer film forming composition as claimed in claim 1 on the resist film and baking the composition to form a resist overlayer film;
exposing the semiconductor substrate covered with the resist overlayer film and the resist film to an exposure light; and
developing a pattern on the substrate after exposure by removing the resist overlayer film and the resist film.

13. The method according to claim 12, wherein the exposure is performed with EUV light (wavelength of 13.5 nm).

14. A method for forming a resist pattern for use in production of a semiconductor device, the method comprising applying the resist overlayer film forming composition as claimed in claim 1 on a resist film formed on a semiconductor substrate and baking the composition to form a resist overlayer film.

15. A method for producing the resist overlayer film forming composition as claimed in claim 1, the method comprising mixing the polymer (P) and a $C_{8-16}$ ether compound as a solvent.

* * * * *